(12) United States Patent
Arimoto

(10) Patent No.: US 10,408,878 B2
(45) Date of Patent: Sep. 10, 2019

(54) CONTROLLER OF ROTARY SWITCH

(71) Applicant: FANUC Corporation, Yamanashi (JP)

(72) Inventor: Kohei Arimoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 124 days.

(21) Appl. No.: 15/223,007

(22) Filed: Jul. 29, 2016

(65) Prior Publication Data

US 2017/0030971 A1 Feb. 2, 2017

(30) Foreign Application Priority Data

Jul. 31, 2015 (JP) .................................. 2015-151926

(51) Int. Cl.
*G01R 31/327* (2006.01)
*H01H 9/54* (2006.01)
*H01H 19/56* (2006.01)

(52) U.S. Cl.
CPC .......... *G01R 31/3277* (2013.01); *H01H 9/54* (2013.01); *H01H 19/56* (2013.01)

(58) Field of Classification Search
CPC .................................................. G01R 31/3277
See application file for complete search history.

(56) References Cited

U.S. PATENT DOCUMENTS

| | | | |
|---|---|---|---|
| 4,196,584 A * | 4/1980 | Oda | G04C 3/007 368/187 |
| 5,130,933 A * | 7/1992 | Kitano | G01P 3/489 324/160 |
| 6,084,400 A * | 7/2000 | Steinich | G01P 3/4815 324/207.13 |
| 2002/0036575 A1* | 3/2002 | Choi | H03M 1/24 341/6 |
| 2002/0169807 A1* | 11/2002 | Sakakura | G05B 19/351 708/3 |
| 2012/0055763 A1* | 3/2012 | Chou | H01H 25/065 200/4 |

(Continued)

FOREIGN PATENT DOCUMENTS

| | | |
|---|---|---|
| JP | S58-115797 U | 8/1983 |
| JP | H0563754 A | 3/1993 |
| JP | 6-147921 A | 5/1994 |

(Continued)

OTHER PUBLICATIONS

Office Action in JP Application No. 2015-151926, dated Jul. 4, 2017, 10 pp.

(Continued)

*Primary Examiner* — Amine Benlagsir
(74) *Attorney, Agent, or Firm* — Hauptman Ham, LLP

(57) ABSTRACT

A controller of a rotary switch receives, via a contact receiver, signals from a plurality of fixed contacts of a rotary switch that rotates a movable contact to connect the movable contact to any of the fixed contacts, and outputs a command based on the received signals. The controller of the rotary switch monitors a transition of an output code received from the contact receiver, and determines that a failure has occurred in the rotary switch when the transition of the output code does not match a transition pattern of the output code of the case where the rotary switch operates normally.

11 Claims, 15 Drawing Sheets

(56) References Cited

U.S. PATENT DOCUMENTS

2012/0093534 A1* 4/2012 Waida ................ G03G 15/2046
399/69
2013/0192967 A1* 8/2013 McCann ................ B60R 16/02
200/5 A

FOREIGN PATENT DOCUMENTS

| JP | H10-64368 A | 3/1998 |
| JP | 2000-123674 A | 4/2000 |
| JP | 2009-70771 A | 4/2009 |
| JP | 2012-48625 A | 3/2012 |
| JP | 2012-94346 A | 5/2012 |
| JP | 2014-127054 A | 7/2014 |
| WO | 2009/113176 A1 | 9/2009 |

OTHER PUBLICATIONS

Office Action in JP Application No. 2015-151926, dated May 1, 2018, 9pp.
Office Action in JP Application No. 2015-151926, dated Nov. 13, 2018, 8 pp.

* cited by examiner

FIG.2

| CONTACT\POSITION | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| SW0 | 0 | 1 | 1 | 0 | 0 | 1 | 1 | 0 | 0 | 1 | 1 | 0 | 0 | 1 | 1 | 0 |
| SW1 | 0 | 0 | 0 | 1 | 1 | 1 | 0 | 0 | 0 | 0 | 1 | 1 | 1 | 0 | 0 | 0 |
| SW2 | 0 | 0 | 0 | 0 | 1 | 0 | 1 | 1 | 1 | 1 | 1 | 1 | 1 | 1 | 0 | 0 |
| SW3 | 0 | 0 | 0 | 0 | 0 | 0 | 0 | 0 | 1 | 1 | 1 | 1 | 1 | 1 | 1 | 1 |

1: ON
0: OFF

FIG.3

| CONTACT\POSITION | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| SW0 | 0 | 1 | 0 | 0 | 0 | 1 | 0 | 1 | 0 | 1 | 0 | 1 | 0 | 1 | 0 | 1 |
| SW1 | 0 | 0 | 1 | 1 | 0 | 0 | 1 | 1 | 0 | 0 | 1 | 1 | 0 | 0 | 1 | 1 |
| SW2 | 0 | 0 | 0 | 0 | 1 | 1 | 1 | 1 | 0 | 0 | 0 | 0 | 1 | 1 | 1 | 1 |
| SW3 | 0 | 0 | 0 | 0 | 0 | 0 | 0 | 0 | 1 | 1 | 1 | 1 | 1 | 1 | 1 | 1 |

1: ON
0: OFF

FIG.4

| CONTACT\POSITION | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| SW0 | 0 | 0 | 1 | 0 | 0 | 1 | 1 | 0 | 0 | 1 | 1 | 0 | 0 | 1 | 1 | 0 |
| SW1 | 0 | 0 | 0 | 1 | 1 | 1 | 0 | 0 | 0 | 0 | 1 | 1 | 1 | 0 | 0 | 0 |
| SW2 | 0 | 0 | 0 | 0 | 1 | 0 | 1 | 1 | 1 | 1 | 1 | 1 | 0 | 1 | 0 | 0 |
| SW3 | 0 | 0 | 0 | 0 | 0 | 0 | 0 | 0 | 1 | 1 | 1 | 1 | 1 | 1 | 1 | 1 |
| MOTOR SPEED[%] | 0 | 10 | 20 | 30 | 40 | 50 | 60 | 70 | 80 | 90 | 100 | 110 | 120 | 130 | 140 | 150 |

| CONTACT POSITION | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| SW0 | 0 | 1 | 1 | 0 | 0 | 1 | 1 | 0 | 0 | 1 | 1 | 0 | 0 | 1 | 1 | 0 |
| SW1 | 0 | 0 | 1 | 1 | 1 | 1 | 0 | 0 | 0 | 0 | 1 | 1 | 1 | 1 | 0 | 0 |
| SW2 | 0 | 0 | 0 | 0 | 1 | 0 | 1 | 1 | 1 | 1 | 1 | 1 | 0 | 0 | 0 | 0 |
| SW3 | 0 | 0 | 0 | 0 | 0 | 0 | 0 | 0 | 1 | 1 | 1 | 1 | 1 | 1 | 1 | 1 |
| SWP | 0 | 1 | 0 | 1 | 0 | 1 | 0 | 1 | 0 | 1 | 0 | 1 | 0 | 1 | 0 | 1 |

1: ON
0: OFF

CONTROLLER OF ROTARY SWITCH

RELATED APPLICATIONS

The present application claims priority to Japanese Application Number 2015-151926, filed Jul. 31, 2015, the disclosure of which is hereby incorporated by reference herein in its entirety.

BACKGROUND OF THE INVENTION

1. Field of the Invention

The present invention relates to a controller of a rotary switch that is used in various electronic equipment, and particularly relates to a controller capable of detecting a failure of a rotary switch.

2. Description of the Related Art

A rotary switch used in various electronic equipment and electric equipment rotates a movable contact to connect the movable contact to any of a plurality of fixed contacts, and outputs a code corresponding to its rotation position, and the rotary switch and its controller generally have a configuration shown in FIG. 1.

FIG. 1 shows an example of the rotary switch in which 4 contacts including fixed contacts SW0 to SW3, 5 terminals, 16 positions, and a 0 V common are used. In a rotary switch 1, the fixed contacts SW0 to SW3 are turned ON/OFF in correspondence to its rotation position (Position), and the rotary switch 1 outputs an output code based on ON/OFF thereof. A contact receiver 3 (3-0, 3-1, 3-2, 3-3) converts contact outputs of the rotary switch 1 to electrical signals, and sends them to input ports PT0 to PT3 of a microcomputer 2. The microcomputer 2 analyzes the output code based on voltage levels of the signals received at the input ports PT0 to PT3, and outputs a command instructed in the rotary switch.

In the case where input ports for a digital signal are used as the input ports PT0 to PT3 of the microcomputer 2, the contact receiver 3 is configured by a pull-up resistor, a low-pass filter, a waveform shaping circuit, and a voltage level conversion circuit, for example. Note that, in analysis by software of the microcomputer 2, when high level signals are input to the input ports PT0 to PT3, it is intuitively determined that the contact of the rotary switch is ON (positive logic), and hence inverters 3-0, 3-1, 3-2, and 3-3 are used in the contact receiver 3 in FIG. 1, but the inversion by the inverters is not essential.

In addition, in the case where the output code of the rotary switch 1 is configured by the Gray code, its output code table is such as the one shown in FIG. 2. In the case where the output code of the rotary switch 1 is configured by the binary code, its output code table is such as the one shown in FIG. 3.

In each of the output code tables in FIGS. 2 and 3, "1" means that the fixed contacts SW0 to SW3 are ON, and "0" means that they are OFF.

An example in which the rotary switch 1 is used includes the case where the rotary switch is used as an override switch that sets the speed of a motor of a machine tool. In this case, the microcomputer 2 reads and analyzes the output code of the rotary switch 1 based on the signals input to the input ports PT0 to PT3, and outputs a speed command (override value). For example, in the case where the output code of the rotary switch 1 is the Gray code shown in FIG. 2, a motor speed command shown in FIG. 4 is output. Note that the output motor speed is expressed in percentage (%) of a reference value in FIG. 4.

In the case where the rotary switch is used as the override switch of the machine tool, when the rotary switch (overdrive switch) 1 fails and outputs an abnormal code, there are cases where the motor rotates at an unintended speed to damage the machine tool or a workpiece and pose a danger.

For example, when the position of the rotary switch is set to "0" in order to stop the motor, in the case where the fixed contact SW3 fails and is in an ON state "1", and the output code [1000] (SW3=1, SW2=0, SW1=0, SW0=0) is output, and when the output code of the rotary switch is configured by the Gray code output, the speed command (override value) 150% is output from the microcomputer 2. With this, the motor rotates at the unintended speed (a speed corresponding to 150% of the reference speed), which poses a danger.

In order to prevent such a danger and malfunction, a rotary switch 1' with a parity bit shown in FIG. 5 is used as a method for detecting the failure of the rotary switch.

In the example shown in FIG. 5, a fixed contact SWP of the parity bit (parity bit terminal) is added to the rotary switch 1 shown in FIGS. 1, and 5 contacts, 6 terminals, 16 positions, and the 0 V common are used. Similarly to the fixed contacts SW0 to SW3, the output of the fixed contact SWP of the parity bit is connected to the input port (not shown) of the microcomputer 2 via the contact receiver 3.

In addition, when the output code of the rotary switch 1' is configured by the Gray code output shown in FIG. 2, the code shown in the output code table in FIG. 6 is output. In this example, the case of an even parity is shown. The microcomputer 2 performs parity check by using software stored in the microcomputer 2, determines that a failure has occurred in the rotary switch when a parity alarm is detected as the result of the parity check, brings the equipment such as the machine tool into a safe state, and performs alarm display or the like.

Note that the prior art that uses the rotary switch with the parity bit is disclosed in, e.g., Japanese Patent Application Laid-open No. 5-63754.

The failure of the rotary switch is detected by using the rotary switch with the parity bit as the rotary switch. However, the rotary switch with the parity bit is large in size, and there is no small rotary switch with the parity bit.

SUMMARY OF THE INVENTION

To cope with this, an object of the present invention is to provide a controller of the rotary switch that does not require the contact of the parity bit and is capable of detecting the failure of the rotary switch even when the rotary switch is small in size.

A controller of a rotary switch according to the present invention receives, via a contact receiver, signals from a plurality of fixed contacts of a rotary switch that rotates a movable contact to connect the movable contact to any of the fixed contacts, and outputs a command based on an output code of the rotary switch formed of the received signals. The controller of the rotary switch includes a failure detection unit that monitors a transition of the output code received from the contact receiver and determines that a failure has occurred in the rotary switch when the failure detection unit detects the transition that does not match a transition pattern of the output code of a case where the rotary switch operates normally.

The failure detection unit may be configured by a microcomputer and software that operates in the microcomputer, an output of the contact receiver may be connected to an input port of the microcomputer, and, the failure detection unit may determine and monitor, by the software, the output code determined from a signal state of the input port when determining whether a failure has occurred in the rotary switch or not.

The input port of the microcomputer may be a digital input port.

The input port of the microcomputer may be an analog port, and the failure detection unit can compare a predetermined voltage with a voltage of each signal input to the input port, determine the output code by judging an ON/OFF state of each fixed contact, and determine whether or not a failure has occurred in the rotary switch based on the transition of the output code.

The failure detection unit may be configured by hardware.

The failure detection unit may include an unused code detection unit that detects a code that is not assigned to the output code of the rotary switch, and outputs an unused code alarm signal.

The controller of the rotary switch may further include a measurement unit that measures a time during which a voltage of an output signal of the contact receiver is in a predetermined voltage range, and a failure portent detection unit that outputs a signal announcing a portent of the failure when a measured value in the measurement unit reaches a predetermined time.

The controller of the rotary switch may further include a voltage reduction monitoring unit that detects a voltage reduction of a power source of the microcomputer or a generation source that supplies power to the power source, and an electrically writable non-volatile memory, the microcomputer may write the output code input from the input port into the non-volatile memory and retain the output code therein when the voltage reduction monitoring unit detects the voltage reduction, compare the output code input from the input port with the output code retained in the non-volatile memory at the next power-on of the microcomputer, and determine that a failure has occurred in the rotary switch when a mismatch is detected in the comparison.

Since the present invention has the above configuration, it is possible to provide the controller of the rotary switch capable of detecting the failure of the rotary switch even when the rotary switch is not the rotary switch with the parity bit.

BRIEF DESCRIPTION OF THE DRAWINGS

The above and other objects and features of the present invention will become apparent from the following description of preferred embodiments given in conjunction with the accompanying drawings, in which:

FIG. 2 is an output code table when the rotary switch uses the Gray code;

FIG. 3 is an output code table when the rotary switch uses the binary code;

FIG. 4 is a table showing a relationship between the output code and a speed command when the rotary switch is used as an override switch;

DETAILED DESCRIPTION OF THE PREFERRED EMBODIMENTS

Figure 1:
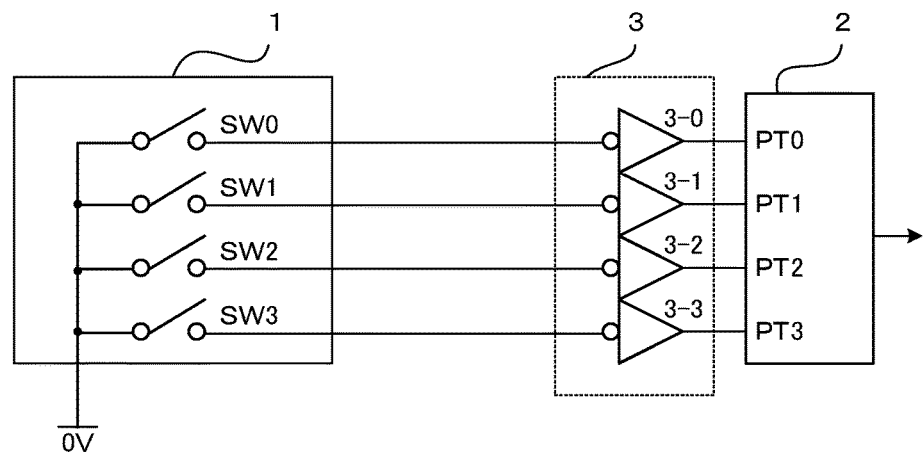
FIG. 1 is a schematic view of a conventional rotary switch and its controller.
Figure 5:
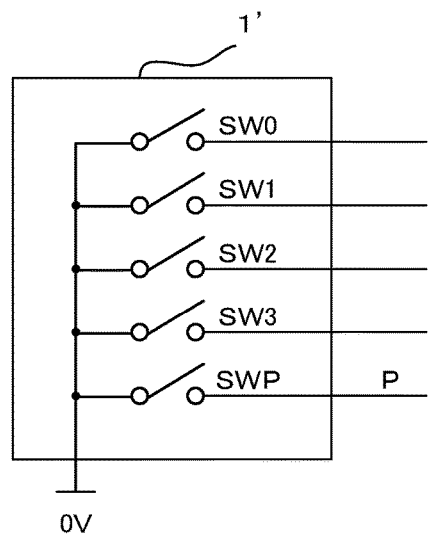
FIG. 5 is a configuration diagram of a rotary switch with a parity bit.

The present invention is characterized in that a failure of a rotary switch is detected by using a transition of a signal generated when the rotary switch is manipulated.

When the rotary switch at a position of Position i is manipulated, the position of the rotary switch transitions from Position i to Position (i−1), Position (i−2) . . . , or to Position (i+1), Position (i+2) . . . , and an output code transitions in accordance with the transition of the position. The output of the rotary switch is expected to transition from the output code at Position i to the output code at Positon (i−1) or Position (i+1) that is adjacent to Position i. Thus, when the rotary switch is manipulated, the transition of the output code output from the rotary switch is determined, and hence it is determined whether a failure has occurred in the rotary switch based on the transition of the output code.

For example, in the case of the rotary switch that outputs the Gray code shown in FIGS. 2 and 4, the permitted transition of the output code from [0000] (SW3=0, SW2=0, SW1=0, SW0=0 at Position 0) is [0001] (SW3=0, SW2=0, SW1=0, SW0=1 at Position 1), and there is no other transition than this, and hence, when the output code transitions to the output code other than this, it is determined that a failure has occurred in the rotary switch.

Note that, in the display of the output code expressed in four digits, the first digit represents the output of the fixed contact SW0, the second digit represents the output of the fixed contact SW1, the third digit represents the output of the fixed contact SW2, and the fourth digit represents the output of the fixed contact SW3.

The permitted transition of the output code from [0001] (Position 1) is the output code at the adjacent position [0011] (SW3=0, SW2=0, SW1=1, SW0=1 at Position 2) or [0000] (Position 0), and there is no other transition than these two; hence, when the output code transitions to the output code other than these, it is determined that a failure has occurred in the rotary switch. Similarly, the output code to which the output code transitions from the output code [0011] is [0010] or [0001], the output code to which the output code transitions from the output code [0010] is [0110] or [0011]

. . .

. . . and the output code to which the output code transitions from the output code [1000] is [1001], and, when the output code transitions to the output code other than those shown above, it is determined that a failure has occurred in the rotary switch.

Thus, in the present invention, by utilizing the fact that the output code makes the specific transition when the rotary switch is manipulated, it is determined whether a failure has occurred in the rotary switch or not.

However, a chattering is present at the fixed contacts (SW0 to SW3). Accordingly, there is a possibility that it is determined that a failure has occurred in the rotary switch by mistake based on the output code during the chattering. However, since the maximum value of a chattering time is determined by the rotary switch, by performing a chattering removal process that neglects the output code that continues only for a time shorter than the time of the maximum value, it is determined whether or not a failure has occurred in the rotary switch by using the output code after the output code during the chattering is removed.

In the case where the rotary switch of 4-bit Gray code output that has 15 positions or less is used, for example, in the case where the rotary switch having 12 positions is used, 4 unassigned unused codes are present. In the case where the unused code is detected in the codes after the chattering removal is performed, it is determined that the failure is present immediately. With this, there is a possibility that the failure can be found before the rotary switch is rotated.

In addition, in the case where the output code of the rotary switch is the binary code shown in FIG. 3, there are cases where the output code changes by 2 bits or more between adjacent positions. Further, as these 2 bits do not necessarily change simultaneously, there are cases where a signal that does not correspond to any of the adjacent positions is output for a short time period at the time of position switching.

For example, when the rotary switch is manipulated from Position 1 to Position 2, the output code of the rotary switch transitions from [0001] to [0010]. The fixed contact SW0 changes from "1" to "0" and the fixed contact SW1 changes from "0" to "1" so that the 2 bits change. In the bit change order, when it is assumed that the fixed contact SW0 changes first and the fixed contact SW1 then changes, the change of the output code is [0001]→[0000]→[0010] and, on the other hand, conversely, when it is assumed that fixed contact SW1 changes first and the fixed contact SW0 then changes, the change of the output code is [0001]→[0011]→[0010].

Thus, when the position of the rotary switch changes from "1" to "2", and the output code changes from [0001] to [0010], the output code [0000] or [0011] having a short duration is output during the change. Among them, the latter output code [0011] does not correspond to the output code [0000] at Position 0 adjacent to Position 1 or the output code [0010] at Position 2 adjacent thereto, there is a possibility that it is determined that the failure is present. However, the duration of the intermediate output code that appears during the switching of the position is short so that the output code is removed by a chattering removal method, and hence an erroneous determination is not made due to the intermediate short-duration output code.

Hereinbelow, a first embodiment of a controller of the rotary switch according to the present invention will be described by using FIGS. 7 to 11.

Figures 6, 7:
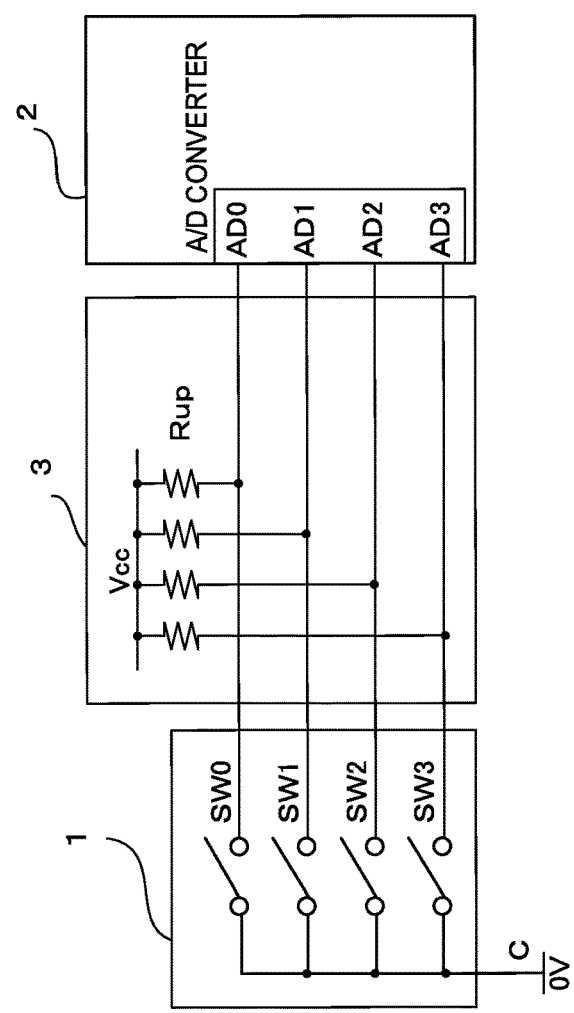
FIG. 6 is an output code table when the rotary switch with the parity bit uses the Gray code of an even parity.
FIG. 7 is a block diagram showing an outline of a controller of a rotary switch according to a first embodiment of the present invention.

FIG. 7 is a block diagram of the controller of the rotary switch according to the present invention.

The controller uses an analog input port (input of an A/D converter provided in a microcomputer) as an input port of a microcomputer 2, and a contact receiver 3 is configured only by a pull-up resistor. This configuration is no different from that of the conventional controller of the rotary switch, and is different from the conventional art in that a failure detection unit configured by software of the microcomputer is provided, as will be described later.

When the fixed contacts (SW0 to SW3) are turned ON, an on-voltage Von that is obtained by dividing a voltage Vcc by an on-resistance (Ron) of the contact and a pull-up resistor Rup is applied to each of terminals (AD0 to AD3) of the A/D converter and, when the contacts are turned OFF, an off-voltage Voff obtained by dividing the voltage Vcc by an off-resistance (Roff) of the contact and the pull-up resistor Rup is applied thereto. The output code is read by setting a threshold voltage of an ON/OFF determination to a proper value between the voltage Von and the voltage Voff and determining an ON/OFF state of the contact using the software of the microcomputer 2. The stage up to the reading of the output code is the same as that of the conventional art and, further, in the embodiment of the present invention, the failure of the rotary switch is detected by using the output code read in this manner, and the failure detection unit is configured by the software.

Voltages of signals input to the individual terminals (AD0 to AD3) of the A/D converter are voltages by ON/OFF of the fixed contacts SW0 to SW3 of the rotary switch via the contact receiver 3, and hence the signals input to the individual terminals (AD0 to AD3) of the A/D converter are referred to as contact output signals SSW0 to SSW3, and their voltages are referred to as contact output voltages.

Figure 8:
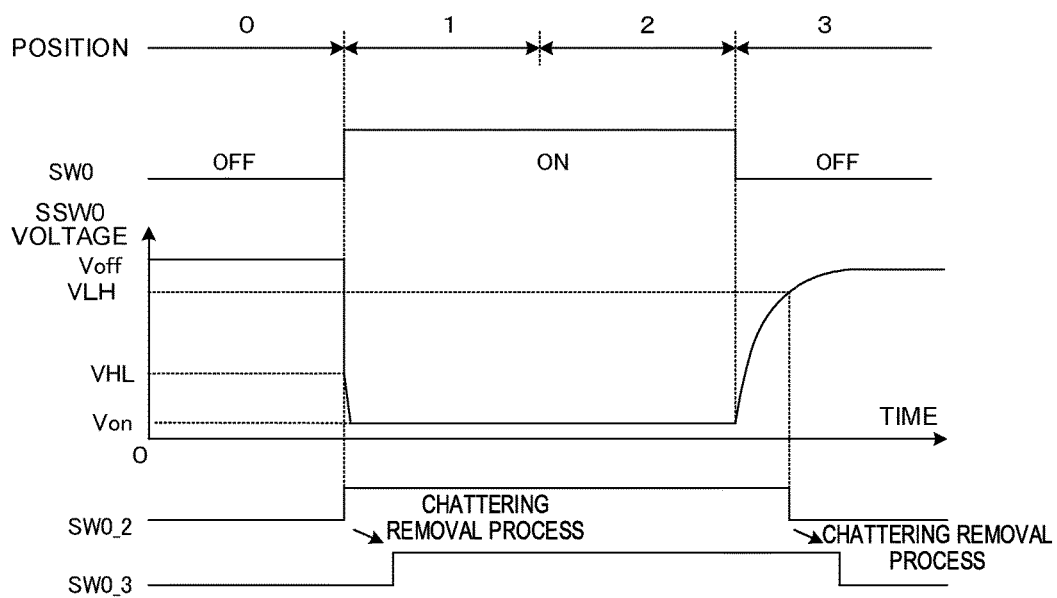
FIG. 8 is an illustrative view of an operation of ON/OFF reading of a fixed contact of the rotary switch in FIG. 7.

FIG. 8 show, as an example in which ON/OFF of the contact in the controller in FIG. 7 is judged, the case of the fixed contact SW0 in which the microcomputer 2 judges and reads ON/OFF of the contact when the rotary switch 1 of the Gray code (FIG. 2) is rotated from Position 0 to Position 3. The same applies to the cases of the fixed contacts SW1, SW2, and SW3 other than the fixed contact SW0.

In FIG. 8,

"VHL" is a threshold voltage for determining whether the contact is switched from OFF to ON, and the microcomputer determines that the contact (SW0) has been turned ON when the voltage input to the terminal (AD0) of the A/D converter (the voltage of the contact output signal SSW0) has crossed the threshold voltage VHL downward from above (i.e., when the terminal input voltage that is higher than the threshold voltage VHL has become lower than the threshold voltage VHL).

"VLH" is a threshold voltage for determining whether or not the contact is switched from ON to OFF, and the microcomputer determines that the contact (SW0) has been turned OFF when the voltage input to the terminal (AD0) of the A/D converter (the voltage of the contact output signal SSW0) has crossed the threshold voltage VLH upward from below (i.e., when the terminal input voltage that is lower than the threshold voltage VLH has become higher than the threshold voltage VLH).

"SW0_2" is an internal signal of the microcomputer, and is a signal indicative of the ON/OFF state of the fixed contact SW0 that is determined by the software of the microcomputer with an SSW0 voltage input to the terminal AD0 of the A/D converter and the threshold voltages VHL and VLH and is also a signal before the chattering removal process is performed.

"SW0_3" is an internal signal of the microcomputer and is a signal obtained by removing the chattering from the internal signal SW0_2, and the output code of the rotary switch is determined based on this signal.

When the rotary switch is rotated and the position is changed from Position 0 to Position 1, the fixed contact SW0 is turned ON, and the voltage input to the terminal AD0 of the A/D converter (SSW0 voltage) is reduced from the off-voltage Voff to the on-voltage Von. With the voltage reduction, the voltage crosses the threshold voltage VHL for determining whether or not the contact is ON downward from above, and hence the internal signal SW0_2 becomes "1 (ON)", this signal is subjected to the chattering removal process, and the internal signal SW0_3 becomes "1 (ON)".

When the rotary switch 1 is further rotated and reaches Position 3, the fixed contact SW0 is turned OFF so that the voltage (SSW0 voltage) input to the terminal AD0 of the A/D converter rises from the on-voltage Von to the off-voltage Voff. During the rise, the voltage exceeds the threshold voltage VLH, and hence the internal signal SW0_2 becomes "0 (OFF)", the signal is subjected to the chattering removal process, and the internal signal SW0_3 becomes "0 (OFF)".

Similarly, the same process is performed based on the voltages input to the terminals AD1, AD2, and AD3 of the A/D converter, internal signals SW1_3, SW2_3, and SW3_3 indicative of ON/OFF of the contacts SW1, SW2, and SW3 are determined, the output code is determined by using the code represented by the internal signals SW0_3, SW1_3, SW2_3, and SW3_3, and it is further determined whether a failure has occurred in the rotary switch or not.

Figure 9:
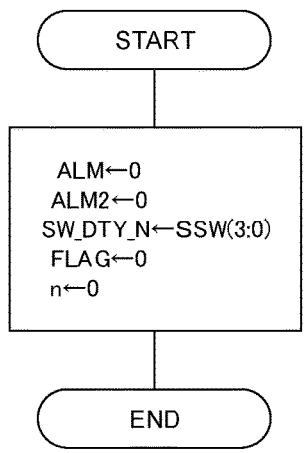
FIG. 9 is a flowchart of an initial setting in a flowchart showing an algorithm of a failure detection process of the rotary switch in FIG. 7.
Figure 10:
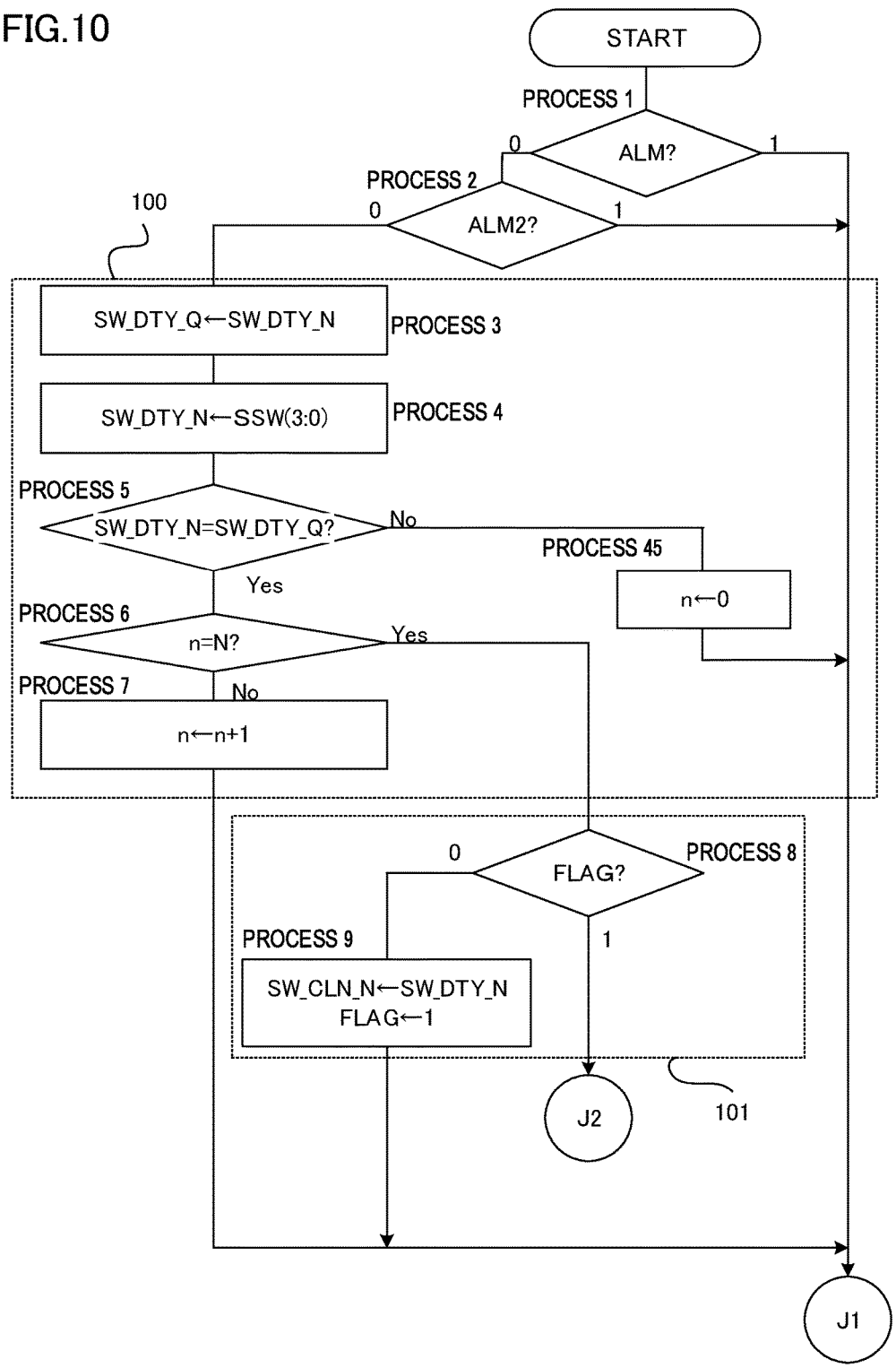
FIG. 10 is a flowchart showing an algorithm of a process that is periodically performed in each predetermined period as the failure detection process of the rotary switch in FIG. 7.
Figure 11:
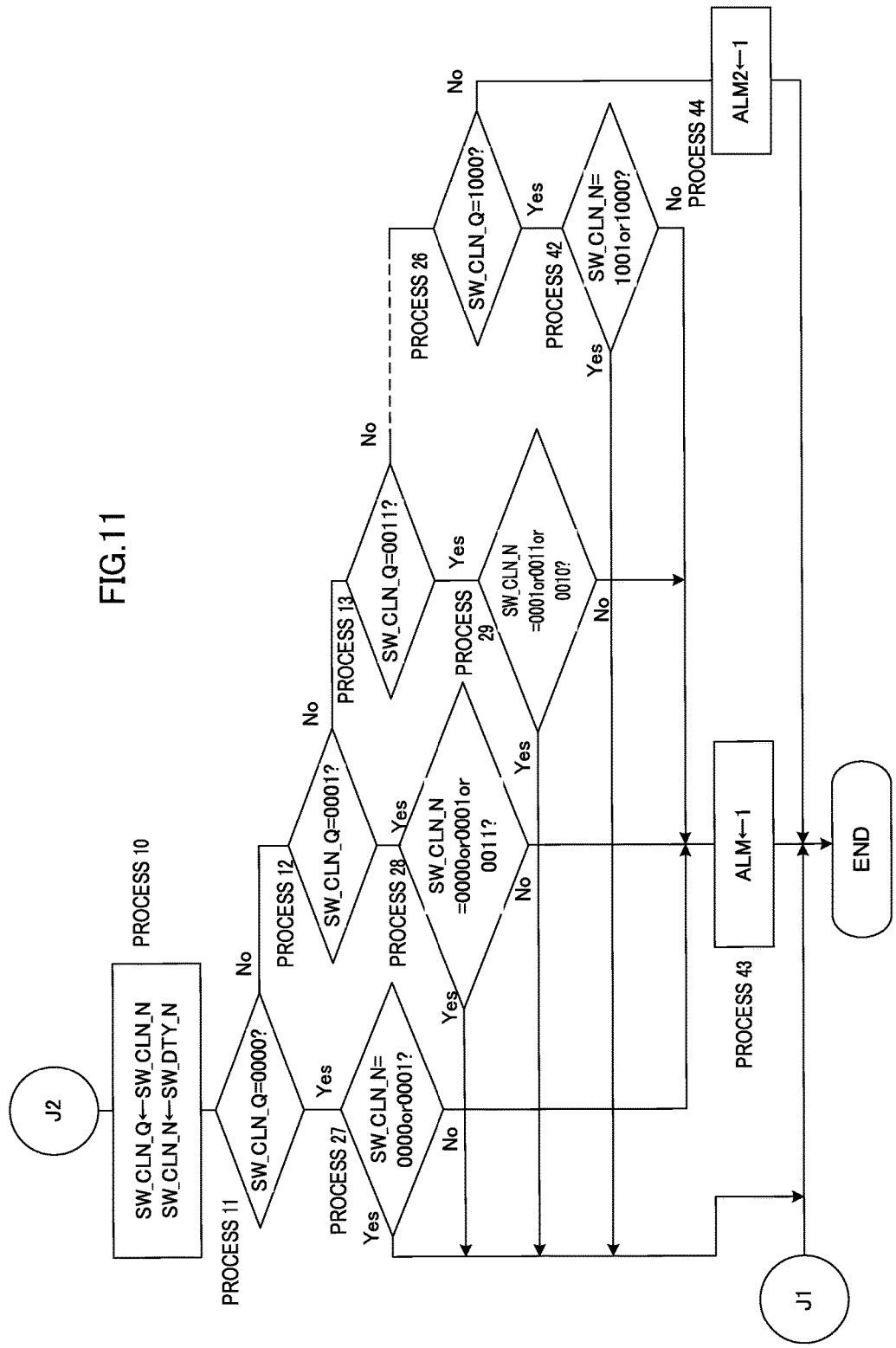
FIG. 11 is a flowchart subsequent to FIG. 10.

Each of FIGS. 9, 10, and 11 is a flowchart showing an algorithm of software for detecting the failure of the rotary switch executed by the microcomputer 2 as the failure detection unit.

This software is configured by an initial process shown in FIG. 9 and a process shown in FIGS. 10 and 11 that is executed in each predetermined period. The initial process is a process that gives initial values to variables used in the process executed in each predetermined period, and is executed only once at power-on. The process executed in each predetermined period is a process that is performed, e.g., every millisecond after the initial process is completed, and is configured by the following processes.

(i) chattering removal process of the output code of the rotary switch (ii) process of detecting the code abnormal transition and the unused code in the codes after the chattering removal (iii) other processes First, variables used in the algorithm in the flowcharts in FIGS. 9, 10, and 11 will be described.

"ALM" is a variable indicative of a failure alarm, the initial value of "ALM" is 0, and "ALM" is set to 1 when a transition that does not match a transition pattern of the signal of the case where the rotary switch operates normally is detected in the output code of the rotary switch after the chattering removal.

"ALM2" is a variable indicative of an unused code alarm, the initial value of "ALM2" is 0, and "ALM2" is set to 1 when the unused code is detected in the output code of the rotary switch after the chattering removal.

"FLAG" is a variable that functions as a flag, the initial value of "FLAG" is 0, and "FLAG" is set to 1 when SW_CLN_N is determined.

"n" is a counter and is a variable indicative of the number of times of successive detection of the same code when the code before the chattering removal is monitored in each predetermined period. This variable is used for the chattering removal. Note that, when n reaches N, n is clamped, and it is determined that "the current code does not include the chattering". In the case where the code before the chattering removal is different from the code in the previous period, n is cleared to 0.

"N" is a value at which the increment of n described above is clamped. In the case where the above-described "process executed in each predetermined period" is performed every millisecond and the maximum value of the chattering time is 10 milliseconds, N=10 milliseconds/1 millisecond=10 is satisfied.

"SW_DTY_Q" is an abbreviation of SW_DTY_Q(3:0), and stores the signal (output code) before the chattering removal that is sampled in the process in the previous period.

"SW_DTY_N" is an abbreviation of SW_DTY_N(3:0), and stores the signal (output code) before the chattering removal that is sampled in the process in the current period.

"SW_CLN_Q" is an abbreviation of SW_CLN_Q(3:0), and stores the signal (output code) after the chattering removal in the previous period.

"SW_CLN_N" is an abbreviation of SW_CLN_N(3:0), and stores the signal (output code) after the chattering removal in the current period.

"SSW(3:0)" represents a 4-bit contact output signal (output code) configured by the contact output signals SSW0 to SSW3 from the fixed contacts SW0 to SW3.

FIG. 9 is the flowchart showing the flow of the initial process that is executed only once at power-on.

When the power is turned on, the variable ALM indicative of the failure alarm and the variable ALM2 indicative of the unused code alarm are set to "0", and the 4-bit contact output signal (output code) SSW(3:0) at power-on is stored in the variable SW_DTY_N that stores the signal (output code) input from the input port in the current period. In addition, the variable FLAG that functions as the flag and the counter n are set to "0", and the initial process is ended.

Next, the microcomputer 2 executes the process for detecting the failure of the rotary switch shown in the flowchart in each of FIGS. 10 and 11 in each predetermined period.

First, it is determined whether or not the variable ALM indicative of the failure alarm is "1" ("0" in the initial setting) (Process 1) and, when the variable ALM is not "1", it is then determined whether or not the variable ALM2 indicative of the unused code alarm is "1" ("0" in the initial setting) (Process 2). Subsequently, when the variable ALM2 is not "1", the output code stored in the variable SW_DTY_N (the output code at power-on is stored in the initial setting shown in FIG. 9 initially) is stored in the variable SW_DTY_Q (Process 3).

Next, the contact output signal (output code) SSW(3:0) from the fixed contacts SW0 to SW3 input from the input ports is read and stored in the variable SW_DTY_N (Process 4). As a result, the output code sampled in the current period is stored in the variable SW_DTY_N, and the output code (initially, the output code at power-on set at the time of the initial setting) sampled in the previous period is stored in the variable SW_DTY_Q. Subsequently, it is determined whether or not the output codes stored in the two variables match each other (Process 5). When the output code stored in SW_DTY_N matches the output code stored in SW_DTY_Q, it is determined whether or not the value of the variable n as the counter is equal to the clamp value N (Process 6). When n is not equal to N, 1 is added to the variable n (Process 7), and the process in the current period is ended. Thereafter, while the rotary switch 1 is not manipulated, the processes from Process 1 to Process 7 are repeatedly executed in each period.

The processes in Process 1 to Process 7 are repeatedly executed and the value of the variable n reaches the set clamp value N (i.e., the output code is not changed during N periods), it is determined whether or not the flag FLAG is "1" (Process 8). Since the flag FLAG is initially set to "0" in the initial setting, the flow proceeds to Process 9, the output code stored in the variable SW_DTY_N is stored in the variable SW_CLN_N, the flag FLAG is set to "1" (Process 9), and the process in the current period is ended. Thereafter, while the rotary switch 1 is not manipulated, the processes in Process 1 to Process 6, Process 8, and Process 10 to Process 42 are repeatedly executed in each period.

Note that, in Process 9, the output code stored in the variable SW_CLN_N is the output code that has not been changed at least during a time period in which the counter n is incremented to the clamp value N and, as will be described later, the output code that is not generated by the chattering is stored.

Note that, in the flowchart in FIG. 10, the processes in Process 8 and Process 9 surrounded by a dotted line indicated by a reference numeral 101 correspond to an initial value setting process of the variable SW_CLN_N.

On the other hand, when the rotary switch 1 is manipulated, and the output code determined in the current period that is stored in the variable SW_DTY_N does not match the output code determined in the previous period that is stored in the variable SW_DTY_Q as the result of the determination in Process 5, the variable n indicative of the counter is reset to "0" (Process 45), and the process in the current period is ended.

The counter n is reset in the case where the output code stored in the variable SW_DTY_N does not match the output code stored in the variable SW_DTY_Q. In addition, even in the case where the output codes match each other, when a mismatch is detected before the counter n reaches the clamp value N by Process 6 and Process 7, the counter n is reset, and the flow does not proceed to Process 8. That is, even when the rotary switch 1 is rotated and the chattering occurs during the manipulation, the output code generated by the chattering lasts for a short time period, and the process is ended within a time period during which the counter n is incremented to the clamp value N (a time period equal to N×sampling period), and the flow does not proceed to from Process 6 to Process 8 while the output code by the chattering of the short time period is present. In the flowchart in FIG. 10, the processes from Process 3 to Process 7 and Process 45 surrounded by a dotted line indicated by a reference numeral 100 correspond to the chattering removal process.

On the other hand, when the output code is not changed before the counter n reaches the clamp value N (i.e., in Process 5, when it is determined that the output code stored in the variable SW_DTY_N matches the output code stored in the variable SW_DTY_Q), the flow proceeds from Process 6 to Process 8. When the rotary switch 1 is not manipulated yet, the flag FLAG is set to "1" in the process in Process 9 (the initial value setting process indicated by the reference numeral 101 in FIG. 10), the flow proceeds to Process 10 (see FIG. 11), the output code stored in the variable SW_CLN_N (the output code that is stored initially in Process 9 and, thereafter, stored in Process 10 in the previous period) is stored in the variable SW_CLN_Q, and the output code stored in SW_DTY_N (the output code that is read in Process 4 and has not been changed before the counter n reaches the clamp value N) is stored in the variable SW_CLN_N. That is, the output code after the chattering removal process that is read in the previous period (immediately previous period) is stored in the variable SW_CLN_Q, and the output code after the chattering removal process that is read in the current period (present period) is stored in the variable SW_CLN_N.

Next, it is determined whether or not the transition of the output code is normal with processes from Process 11 to Process 42.

It is determined which output code generated at each position of the rotary switch 1 the output code read in the previous period that is stored in the variable SW_CLN_Q matches. In the present embodiment, since the rotary switch 1 takes 16 positions as shown in FIG. 2, it is determined which one of 16 output codes [0000], [0001], [0011], . . . [1000] the output code matches (Processes 11 to 26). That is, it is determined which one of the 16 output codes generated at the individual 16 positions of the rotary switch 1 the output code stored in the variable SW_CLN_Q matches. When the output code stored in the variable SW_CLN_Q does not match any of the output codes generated at the individual positions of the rotary switch 1 (when the output code does not match any of the 16 output codes in this embodiment), the variable ALM2 is set to "1", and the unused code alarm is output (Process 44). Subsequently, in the period, the processes in Process 1 and Process 2 are executed, and the process in the current period is ended.

On the other hand, when the output code read in the previous period that is stored in the variable SW_CLN_Q matches any of the output codes generated at the individual positons of the rotary switch 1, it is determined whether or not the output code read in the current period that is stored in the variable SW_CLN_N matches the output code stored in the variable SW_CLN_Q or the output code at the position prior or subsequent to the position at which the output code is output.

For example, when it is determined that the output code stored in the variable SW_CLN_Q is [0000] (Process 11), the flow proceeds to Process 27, and it is determined whether or not the output code read in the current period that is stored in the variable SW_CLN_N matches the output code [0000] read in the previous period that is stored in the variable SW_CLN_Q or the output code [0001] at Position 1 as the position subsequent to Position 0 at which the output code [0000] is output. Note that there is no position prior to Position 0, and hence the prior or subsequent position is limited to one position (see the Gray code table in FIG. 2).

Similarly, when it is determined that the output code stored in the variable SW_CLN_Q is [0001] (Process 12), the flow proceeds to Process 28, and it is determined whether the output code read in the current period that is stored in the variable SW_CLN_N matches the output code [0001] read in the previous period that is stored in the variable SW_CLN_Q or the output codes [0000] and [0011] at Positions 0 and 2 as the positions prior and subsequent to Position 1 at which the output code [0001] is output. Thereafter, in processes in Processes 29 to 42, when the variable SW_CLN_Q=[0011] is satisfied, it is determined that the variable SW_CLN_N=[0001], [0011], or [0010] is satisfied, when the variable SW_CLN_Q=[0010] is satisfied, it is determined that the variable SW_CLN_N=[0011], [0010], or [0110] is satisfied, when the variable SW_CLN_Q=[0110] is satisfied, it is determined that the variable SW_CLN_N=[0010], [0110], or [0111] is satisfied, when the variable SW_CLN_Q=[1001] is satisfied, it is determined that the variable SW_CLN_N=[1011], [1001], or [1000] is satisfied, and when the variable SW_CLN_Q=[1000] is satisfied, it is determined that the variable SW_CLN_N=[1001] or [1000] is satisfied.

In the processes in Process 27 to Process 42, when the output code read in the current period that is stored in the variable SW_CLN_N matches the output code read in the previous period that is stored in the variable SW_CLN_Q or the output codes output from the positions prior and subsequent to the position at which the above output code is output, it is determined that the rotary switch 1 is normal, and the process in the current period is ended.

However, in the case where the output code stored in the variable SW_CLN_N does not match the output code stored in the variable SW_CLN_Q or the output codes output at the positions prior and subsequent to the position at which the above output code is output, in the transition of the output code generated when the rotary switch 1 is rotated, the output code is expected to be changed from the output code at its position to the codes at the positions prior and subsequent to the above position, but the different code is output, and hence it is determined that the rotary switch 1 has the failure, the variable ALM is set to 1 (Process 43), and the alarm indicative of the failure is output. Process 1 is performed in the period after the variable ALM is set to 1, and the process in the period is ended.

As described above, the processes shown in FIG. 11 are the processes of detecting the unused code and the code transition abnormality.

Next, a second embodiment of the controller of the rotary switch according to the present invention will be described by using FIG. 12.

In the controller of the rotary switch according to the first embodiment described above, the chattering removal is performed in the software of the microcomputer (the chattering removal process indicated by the reference numeral 100 in FIG. 10), but the chattering removal may also be performed by using a filter. Thus, in the controller of the rotary switch according to the second embodiment, as shown in FIG. 12, the chattering removal is not performed in the software of the microcomputer but performed by using low-pass filters LPF.

The present embodiment is different from the first embodiment shown in the block diagram in FIG. 7 in that the low-pass filters LPF are added to the contact receiver 3, and the signals from the individual contacts SW0. SW1, SW2, and SW3 are input to the individual terminals AD0 to AD3 of the A/D converter via the low-pass filters LPF. In the signals input to the individual terminals AD0 to AD3, the chattering is removed by the low-pass filters LPF and is not present so that the chattering is not present in the internal signals SW0_2 (SW1_2, SW2_2, SW3_2) shown in FIG. 8, and hence the output code is determined based on the internal signals SW0_2, SW1_2, SW2_2, and SW3_2, and the presence or absence of the failure of the rotary switch is determined by using the determined output code.

In this case, in the failure detection process of the rotary switch shown in FIGS. 10 and 11 that is executed in the microcomputer 2, the chattering removal process in Process 3 to Process 7 and Process 45 indicated by the reference numeral 100 in FIG. 10 is not necessary and, in Process 10, the read contact output signal (output code) SSW(3:0) is stored in the variable SW_CLN_N instead of the output code stored in the variable SW_DTY_N.

Note that part of the chattering may be removed by the low-pass filter LPF and the remaining chattering may be removed by the software of the microcomputer and, in this case, the presence or absence of the failure of the rotary switch is determined based on the internal signals SW0_3, SW1_3, SW2_3, and SW3_3 obtained by performing the chattering removal process on the internal signals SW0_2, SW1_2, SW2_2, and SW3_2 obtained by removing part of the chattering using the low-pass filters LPF. As described above, the failure detection process of the rotary switch by the software of the microcomputer 2 is identical with the process shown in the flowcharts in FIGS. 10 and 11.

In each of the first and second embodiments described above, the failure detection unit for detecting the failure of the rotary switch is configured by the software process of the microcomputer, and the failure is detected by the software process, but it is also possible to perform the failure detection of the rotary switch only with hardware.

A third embodiment of the controller of the rotary switch according to the present invention will be described by using FIGS. 13 to 16.

Figure 13:
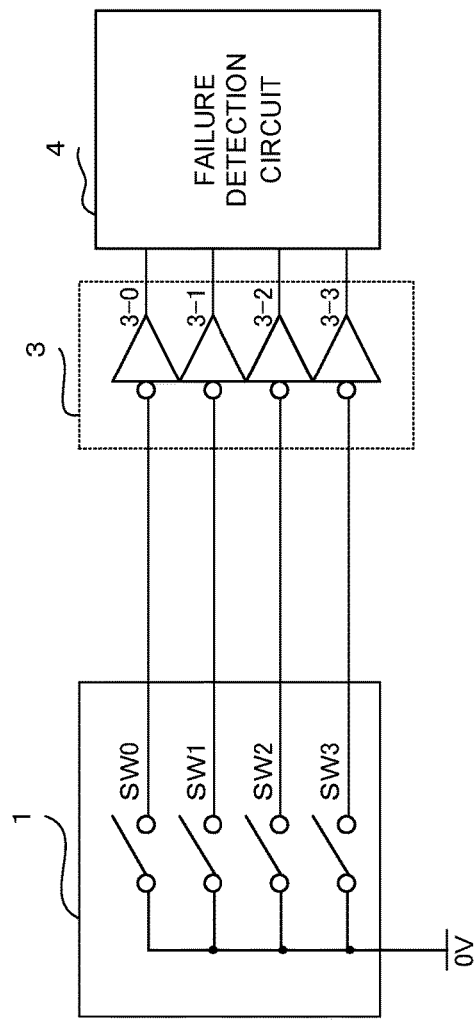
FIG. 13 is a block diagram showing an outline of the controller of the rotary switch according to a third embodiment of the present invention.

As shown in FIG. 13, the controller of the rotary switch according to the third embodiment detects the failure of the rotary switch using a failure detection circuit 4 configured by hardware. This embodiment corresponds to the embodiment in which the microcomputer 2 in the controller of the rotary switch according to the conventional art shown in FIG. 1 is replaced with the failure detection circuit 4.

Figure 14:
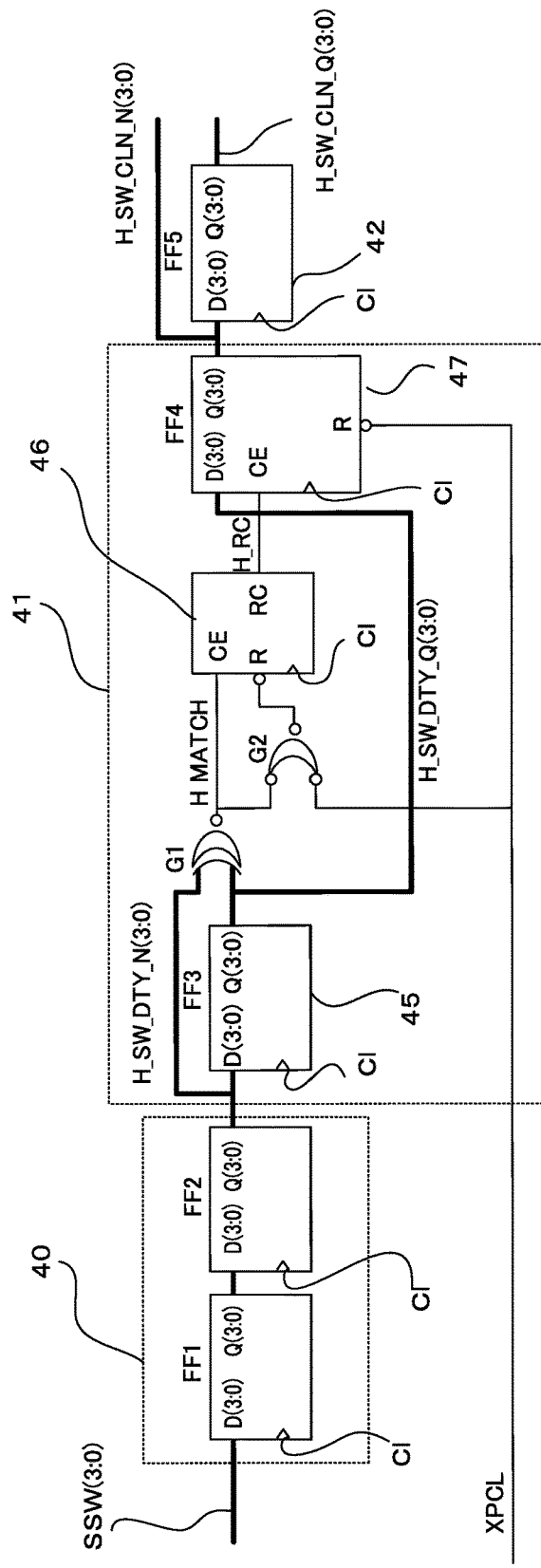
FIG. 14 is a configuration diagram of a synchronization circuit, a chattering removal circuit, and a delay circuit in a failure detection circuit in FIG. 13.
Figure 15:
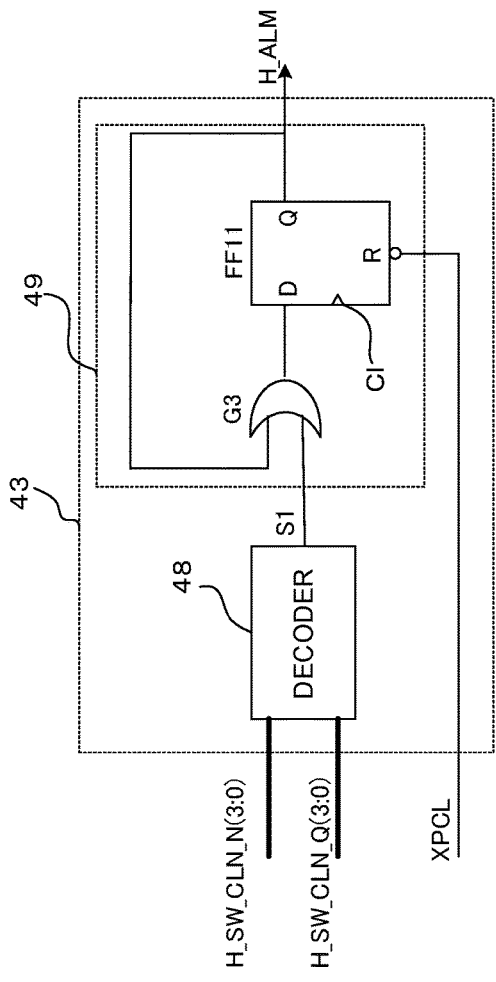
FIG. 15 is a configuration diagram of an abnormal transition detection circuit in the failure detection circuit in FIG. 13.
Figure 16:
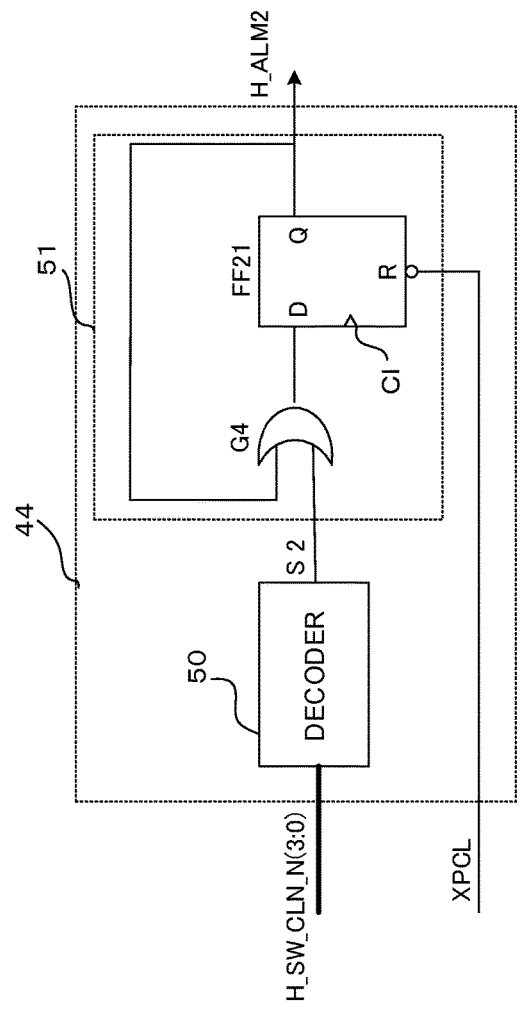
FIG. 16 is a configuration diagram of an unused code detection circuit in the failure detection circuit in FIG. 13.

Each of FIGS. 14, 15, and 16 is a detailed block diagram of the failure detection circuit 4.

The failure detection circuit 4 is configured by a synchronization circuit 40 that synchronizes the output of the contact receiver with the clock of the failure detection circuit, a chattering removal circuit 41, a delay circuit 42, an abnormal transition detection circuit 43, and an unused code detection circuit 44.

The contact output signal SSW(3:0) output from the contact receiver 3 (FIG. 1) changes without being synchronized with the clock of the failure detection circuit 4 so that there is a possibility that subsequent circuits malfunction when the contact output signal SSW(3:0) is used without being altered, and hence, as shown in FIG. 14, the contact output signal SSW(3:0) is input to the synchronization circuit 40 configured by flip-flops FF1 and FF2 at two stages, and is converted to a contact signal H_SW_DTY_N (3:0) that is synchronized with the clock in the synchronization circuit 40.

Signal lines of the contact output signal SSW(3:0) and the contact signal H_SW_DTY_N(3:0) that is synchronized with the clock (not shown) are indicated by using thick lines, whereby the signal lines are indicated as 4-bit signal lines. A clock signal is input to all of the flip-flops FF constituting the failure detection circuit 4 and a clock terminal Cl of a counter.

The contact signal H_SW_DTY_N(3:0) synchronized with the clock is input to a delay circuit 45 and a gate G1 of the chattering removal circuit 41. The delay circuit 45 is configured by a flip-flop FF3, and generates a delay contact signal H_SW_DTY_Q(3:0) by delaying the contact signal H_SW_DTY_N(3:0) by one clock time and outputs the delay contact signal H_SW_DTY_Q(3:0) to the gate G1 and a holding circuit 47. At the gate G1, a match between the delay contact signal H_SW_DTY_Q(3:0) and the contact signal H_SW_DTY_N(3:0) is detected. That is, it is detected that the output of the rotary switch is not changed. While the contact signal H_SW_DTY_N(3:0) is not changed, the gate G1 sets a match signal H_MATCH to 1 and, on the other hand, when the contact signal H_SW_DTY_N(3:0) is changed, the gate G1 sets the match signal H_MATCH to 0 for a time period corresponding to one clock time.

A counter 46 is a counter for measuring the number of clocks in which the match signal H_MATCH is 1, i.e., a time during which the output signal of the rotary switch is not changed, the initial value of the counter 46 is 0, and the match signal H_MATCH 1 is input to a count enable terminal (CE terminal) and 1 is input to a negative logic synchronization reset terminal (R terminal) while the output signal of the rotary switch is not changed, and hence the counter 46 is incremented at the rising of the clock. The count value is clamped at a maximum value H_N (corresponds to the chattering time) and, at the point of time when the count value reaches H_N, a signal H_RC is set to 1 via the RC terminal during one clock, and the subsequent holding circuit 47 configured by a flip-flop FF4 is notified that the contact signal H_SW_DTY_N(3:0) maintains the same value for a time not less than the chattering time continuously. With regard to the value of H_N, for example, in the case where the maximum chattering time is 10 milliseconds and the clock of the abnormality detection circuit is 1 MHz, H_N=10 milliseconds×1 MHz=10000 is satisfied.

The holding circuit (FF4) 47 outputs the delay contact signal H_SW_DTY_Q(3:0)obtained at the point of time when the signal H_RC has become 1 as the contact signal H_SW_CLN_N(3:0) having been subjected to the chattering removal process. The counter 46 is a counter that sets the count value to 0 when 0 is input to the R terminal. In the case where the match signal H_MATCH is 0, 0 is input to the R terminal of the counter via a gate G2, and the count value is set to 0. In this manner, the contact signal H_SW_CLN_N (3:0) from which the chattering is removed is obtained.

Note that a signal XPCL is a power-on reset signal, and the counter 46 and the holding circuit (FF4) 47 are reset when the signal is 0.

The contact signal H_SW_CLN_N(3:0) having been subjected to the chattering removal process is input to the delay circuit 42 configured by a flip-flop FF5, and hence the delay contact signal H_SW_CLN_Q(3:0) delayed by one clock time is obtained.

The two contact signals H_SW_CLN_N(3:0) and H_SW_CLN_Q(3:0) that have been subjected to the chattering removal process and of which one is delayed relative to the other by one clock time are input to a decoder 48 of the abnormal transition detection circuit 43 shown in FIG. 15. When it is determined that a combination of the two contact signals H_SW_CLN_N(3:0) and H_SW_CLN_Q(3:0) is an abnormal combination, the decoder 48 sets a signal S1 to 1, and outputs the signal S1 to a holding circuit 49 configured by a flip-flop FF11 and a gate G3. The holding circuit 49 holds the signal S1, and performs a required process such as bringing a machine into a safe state by setting an alarm signal H_ALM indicative of the failure of the rotary switch to 1 to notify peripheral circuits of the failure thereof.

The number of combinations of the two contact signals H_SW_CLN_Q(3:0) and H_SW_CLN_N(3:0) is 256 (16× 16), and the number of normal combinations is 46 (there are 3 combinations for each of Positions 1 to 14 and 2 combinations for each of Position 0 and Position 15, and hence there are 46 combinations in total). Accordingly, the number of combinations that set the signal S1 to 1 is 210 (256−46). For example, the signal transition from [0000] to [0010] is abnormal, and hence H_SW_CLN_Q(3:0) and H_SW_CLN_N(3:0)=[0000] and [0010] is one of factors that set the signal S1 to 1. Consequently, the decoder 48 is a logical sum of 210 logical products of 8 inputs in disjunctive normal form, and is huge in size. In the case where the decoder 48 is implemented by an application specific integrated circuit (ASIC) or a field programmable gate array (FPGA), the size does not pose a problem but, in the case where the decoder 48 is implemented by a discrete component, the size requires logic compression due to a limited mounting area of a printed circuit board. Note that the logic compression is a publically known technique.

On the other hand, the contact signal H_SW_CLN_N(3:0) from which the chattering is removed is also input to a decoder 50 of the unused code detection circuit 44 shown in FIG. 16. When the decoder 50 decodes the unused code, the decoder 50 sets a signal S2 to "1", and outputs the signal S2 to a holding circuit 51 configured by a flip-flop FF21 and a gate G4. The holding circuit 51 holds the signal S2, and sets an unused code alarm signal H_ALM2 to "1". When the unused code alarm signal H_ALM2 is set to "1", the presence of the signal is notified to peripheral circuits, and the required process such as bringing the machine into the safe state is performed.

In the case where the rotary switch of the 4-bit Gray code output and 12 positions is used, there are 4 unused codes, and hence the disjunctive normal form of the decoder 50 is represented by a logical sum of 4 logical products of 4 inputs.

Note that the decoder 48 shown in FIG. 15 performs decoding with the transition to the unused code regarded as the abnormal transition, and hence the circuit scale of the decoder 50 can be reduced by using such a decoder as the decoder 50 in FIG. 16. In the case of the rotary switch that does not have the unused code, it is not necessary to provide the unused code detection circuit 44 in FIG. 16.

In each of the embodiments described above, when the rotary switch is actually used and manipulated, the failure thereof is detected. When the alarm is output and the presence of the failure is determined, the rotary switch 1 is already unusable, and an operation being executed at this point (for example, a machining operation by the machine tool performed when the rotary switch is used as the override switch of a machine tool) is wasted. If it is possible to detect the portent of the failure, it is possible to prevent the occurrence of the wasted operation.

A fourth embodiment of the controller of the rotary switch according to the present invention will be described by using FIGS. 17 to 20.

When the number of rotations of the rotary switch is increased, the degradation of the contact progresses, and an increase in the on-resistance Ron of the contact and a reduction in the off-resistance Roff thereof are observed. This phenomenon leads to an increase in the voltage Von obtained by dividing the voltage Vcc of the contact receiver 3 by the on-resistance Ron of the contact and the pull-up resistor Rup that is input to each of the terminals (AD0 to AD3) of the A/D converter or a reduction in the voltage Voff obtained by dividing the voltage Vcc by the off-resistance Roff of the contact and the pull-up resistor Rup.

When the on-voltage Von is increased and becomes higher than the threshold voltage VHL, it becomes impossible to detect switching of the fixed contacts SW0 to SW3 from OFF to ON, and it is determined that a failure has occurred in the rotary switch. Similarly, when the off-voltage Voff becomes lower than the threshold voltage VLH, it becomes impossible to detect switching of the fixed contacts SW0 to SW3 from ON to OFF, and it is determined that a failure has occurred in the rotary switch (see FIG. 8 and FIGS. 18 and 19 described later).

To cope with this, before it is determined that a failure has occurred in the rotary switch, the portent of the failure of the rotary switch (degradation of the rotary switch) is detected. It is necessary to monitor the output voltage of the contact receiver with an analog value in order to detect the portent of the failure of the rotary switch, and hence it is necessary to connect the outputs of the contact receiver corresponding to the individual fixed contacts of the rotary switch to analog input ports of the microcomputer.

Figure 12:
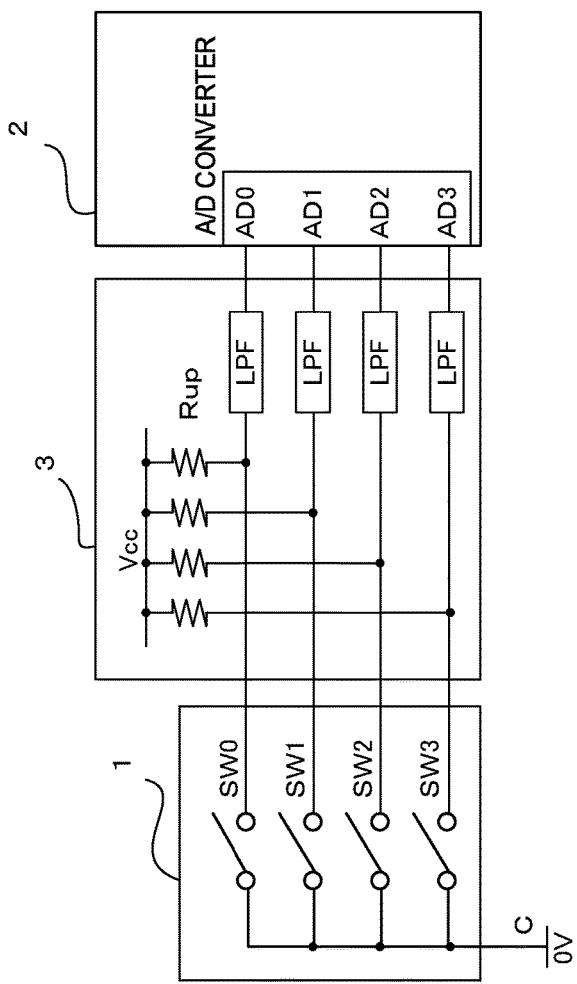
FIG. 12 is a block diagram showing an outline of the controller of the rotary switch according to a second embodiment of the present invention.

To cope with this, in the fourth embodiment of the controller of the rotary switch that detects the portent of the failure of the rotary switch, its hardware configuration is the same as that of the first embodiment shown in FIG. 7 or that of the second embodiment shown in FIG. 12, the determination of the failure of the rotary switch is performed by the software in the microcomputer 2, and the determination of the portent of the failure thereof is also performed by the software.

In the case where, as in the third embodiment shown in FIG. 13, the failure detection of the rotary switch is performed with the failure detection circuit 4 configured by hardware (instead of the software of the microcomputer 2), the fourth embodiment is obtained by adding the microcomputer to the embodiment shown in FIG. 13.

Figure 17:
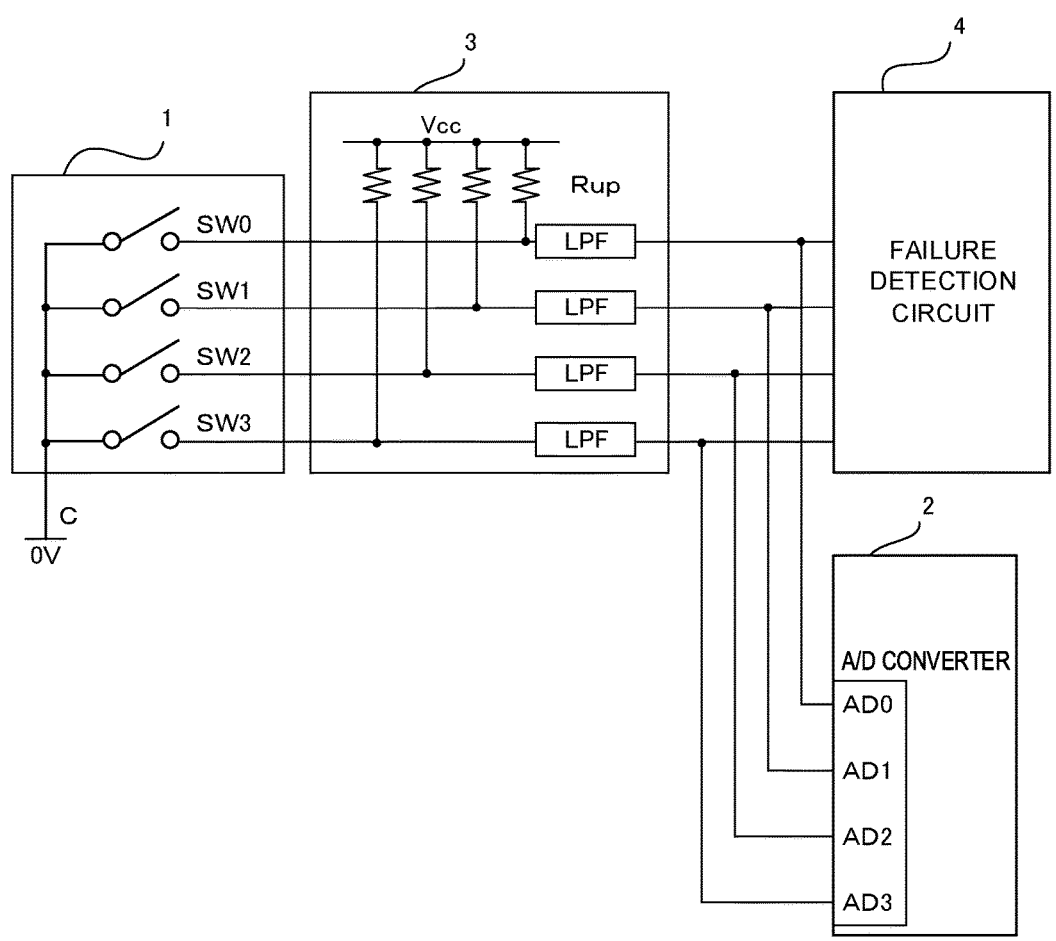
FIG. 17 is a block diagram showing an outline of the controller of the rotary switch according to a fourth embodiment of the present invention.

In the fourth embodiment shown in FIG. 17, the failure of the rotary switch is detected by the failure detection circuit 4 configured by the hardware, and the portent of the failure is detected by the software of the microcomputer 2.

In the fourth embodiment, the microcomputer 2 is added to the third embodiment shown in FIG. 13 and the outputs of the contact receiver of the individual fixed contacts SW0, SW1, SW2, and SW3 of the rotary switch 1 are connected to the analog input ports (the terminals AD0, AD1, AD2, and AD3 of the A/D converter) of the microcomputer 2, and the failure of the rotary switch is detected by the failure detection circuit 4 and the portent of the failure is detected by the microcomputer 2. Note that, in the present embodiment shown in FIG. 17, the detection of the failure of the rotary switch by the failure detection circuit 4 and the detection of the portent of the failure by the microcomputer 2 require the chattering removal, but the chattering removal does not need to be performed individually, and hence the low-pass filters LPF are put in the contact receiver 3, and the chattering removal for the detection of the failure of the rotary switch and the chattering removal for the detection of the portent of the failure are collectively performed.

Figure 18:
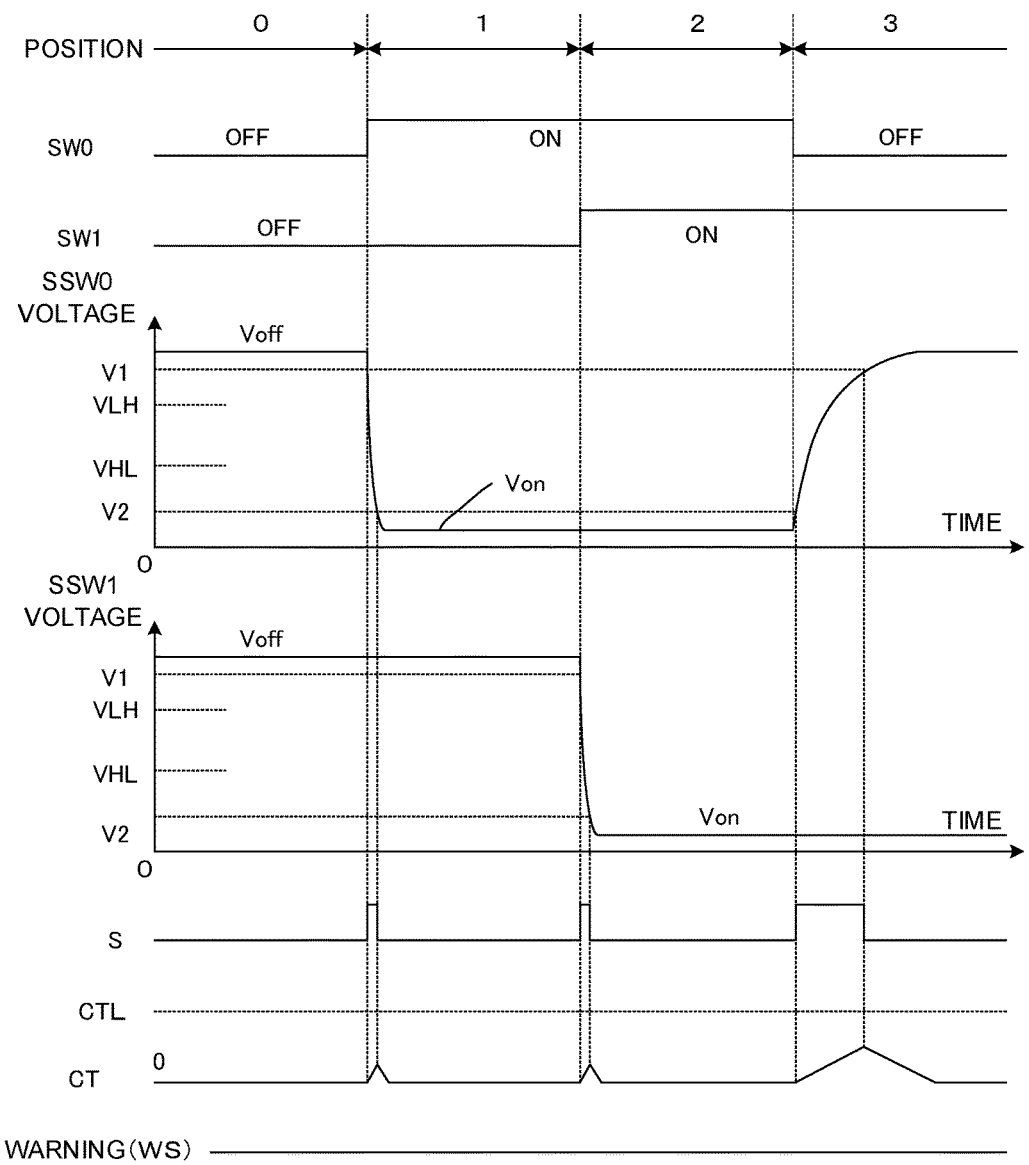
FIG. 18 is an illustrative view of a portent detection operation by the controller of the rotary switch in FIG. 17 (a view when the portent is not detected)
Figure 19:
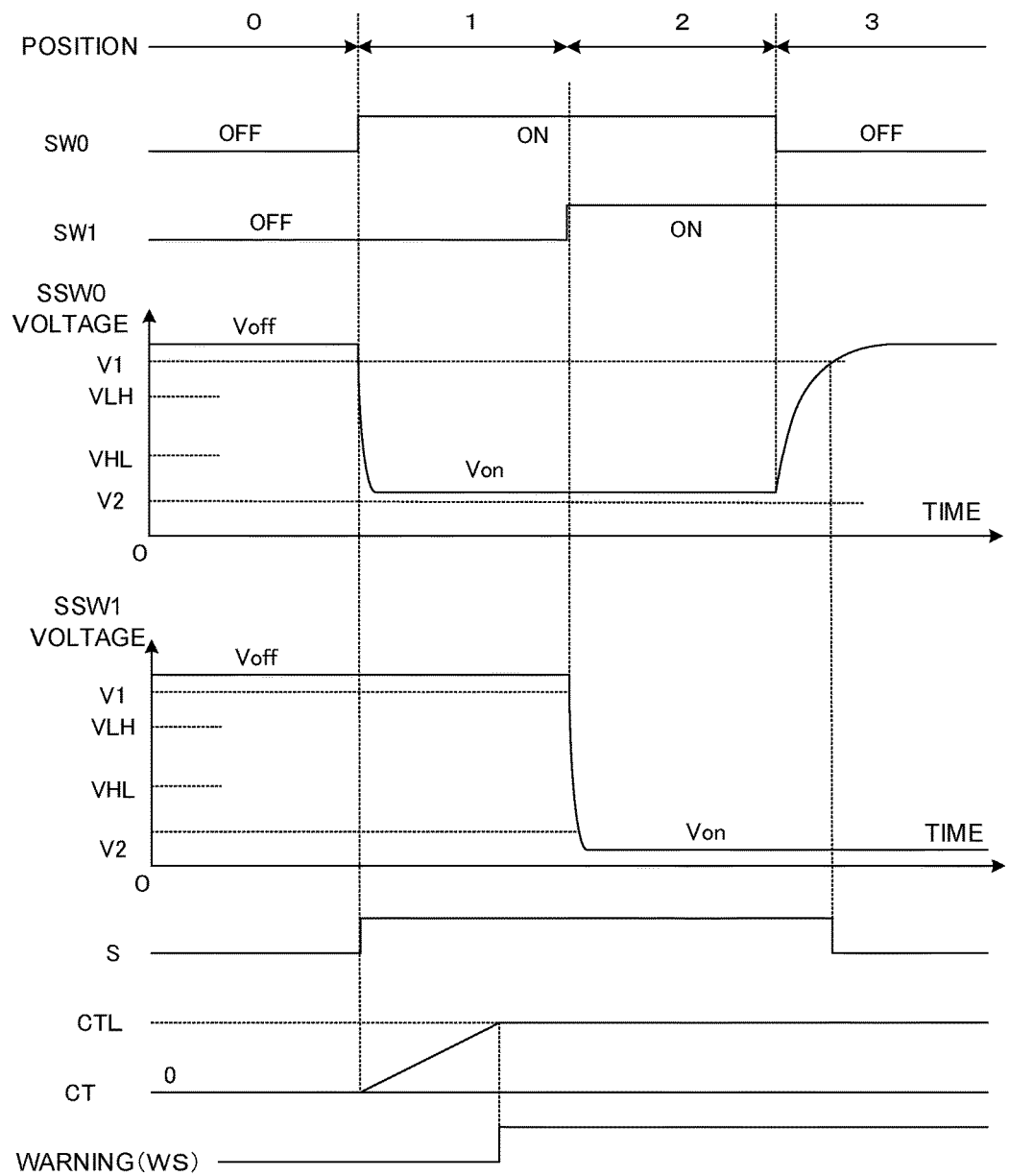
FIG. 19 is an illustrative view of the portent detection operation by the controller of the rotary switch in FIG. 17 (a view when the portent is detected)

Each of FIGS. 18 and 19 is a timing chart for explaining an example of a portent detection operation when the rotary switch 1 of the Gray code output is rotated from Position 0 to Position 3. FIG. 18 is an example in which a warning signal of the failure portent is not generated, and FIG. 19 is an example in which the warning signal of the failure portent is generated. Note that, with regard to the fixed contacts SW2 and SW3, ON/OFF thereof are not changed and they remain OFF, and hence they are omitted and are not described in FIGS. 18 and 19.

In FIGS. 18 and 19,

"the SSW0 voltage and the SSW1 voltage" are voltages input to the analog input ports (the terminals of the A/D converter) AD0 and AD1 of the microcomputer.

"VLH and VHL" are, as described above with reference to FIG. 8, the threshold voltages for detecting the failure of the rotary switch.

"V1" is a threshold voltage for detecting a reduction in the off-resistance Roff, and is set to a voltage higher than the threshold voltage VLH for the failure detection and lower than the off-voltage Voff in order to generate a warning for announcing the portent of the failure and an alarm for announcing the failure in this order (Voff>V1>VLH).

"V2" is a threshold voltage for detecting an increase in the on-resistance Ron, and the threshold voltage V2 is also set to a voltage lower than the threshold voltage VHL for the failure detection and higher than the on-voltage Von in order to generate the warning for announcing the portent of the failure and the alarm for announcing the failure in this order (Von<V2<VHL).

"S" is an internal signal in the microcomputer, and is a signal that is asserted and set to "1" when at least one of the voltages (the SSW0 voltage, the SSW1 voltage, and the like) input to the input ports (AD0, AD1, AD2, and AD3) of the microcomputer is not less than the threshold voltage V2 and not more than the threshold voltage V1.

"CT" is a counter that measures a time during which the signal S is "1" (is asserted).

"CTL" is a set value for issuing the warning signal of the failure portent, and the warning signal is output when the measured value of the counter CT reaches the set value CTL.

When the rotary switch 1 is not manipulated and is not rotated, switching of the fixed contacts SW0 to SW3 to ON/OFF is not performed and the SSW0 voltage to the SSW3 voltage input to the individual ports AD0 to AD3 are not changed, and hence the signal S is not asserted, and the warning signal is not generated. On the other hand, when the rotary switch 1 is manipulated and moved from Position 0 to Position 1, the fixed contact SW0 is turned ON, and the SSW0 voltage input to the input port AD0 is reduced from the off-voltage Voff to the on-voltage Von.

In the process of the voltage reduction, in a section in which the SSW0 voltage is not more than the threshold voltage V1 and not less than the threshold voltage V2, the signal S is asserted. The counter CT measures the time during which the signal S is asserted and set to "1", but, in an example shown in FIG. 18, the SSW0 voltage becomes equal to or less than the threshold voltage V2 in a short time period, and hence the measured value of the counter CT does not reach the set value CTL set for the warning.

In addition, when the rotary switch 1 is rotated to Position 2, the fixed contact SW1 is turned ON and the SSW1 voltage is reduced. However, also in this case, the section in which the SSW1 voltage is not more than the threshold voltage V1 and not less than the threshold voltage V2 is short and a time during which the signals is asserted is short, and hence, similarly, the measured value in the counter CT does not reach the set value CTL. Further, when the rotary switch 1 reaches Position 3, the fixed contact SW0 is turned OFF, and the SSW0 voltage is increased to the off-voltage Voff. In the process of the increase of the voltage, the signal S is asserted in the section in which the SSW0 voltage is not less than the threshold voltage V2 and not more than the threshold voltage V1. However, also in this case, the assertion time is short, the measured time of the counter CT does not reach the set value CTL, and the warning signal of the failure portent is not output. Thus, FIG. 18 shows an example in which the rotary switch 1 is not degraded and operates normally.

On the other hand, when the rotary switch is degraded, the on-resistances Ron of the fixed contacts SW0 to SW3 are increased, and the on-voltage Von input to the input port is not reduced to a value not more than the threshold voltage V2, the warning signal of the failure portent is generated. FIG. 19 shows an example of a state in which the on-resistance Ron of the fixed contact SW0 is increased and the on-voltage Von of the SSW0 voltage input to the input port AD0 is not reduced to a value not more than the threshold voltage V2.

When the rotary switch 1 is rotated to Position 1, the fixed contact SW0 is turned ON, and the SSW0 voltage is reduced from the off-voltage Voff to the on-voltage Von. However, the on-resistance Ron of the fixed contact SW0 is large, and hence the on-voltage Von is not reduced to a value not more than the threshold voltage V2, and the SSW0 voltage maintains the on-voltage Von until the rotary switch is rotated to Position 3 and the fixed contact SW0 is turned OFF. As a result, during a time period in which the fixed contact SW0 is turned ON, the SSW0 voltage becomes equal to or less than the threshold voltage V1, the fixed contact SW0 is turned OFF, and the SSW0 voltage exceeds the threshold voltage V1 (a time period in which V2<the SSW0 voltage<V1 is satisfied), the signal S is asserted and set to "1". When the signal S is asserted and set to "1", the counter CT starts the time measurement and, when the value of the counter CT reaches the set value CTL set for the warning, the warning signal is output.

In the example shown in FIG. 19, the on-voltage Von is not more than the threshold voltage VHL set for the ON/OFF judgment of the fixed contact (SW0), and hence the alarm indicative of the failure is not generated, and it is possible to continuously use the rotary switch. However, when the fixed contact (SW0) is degraded to such a degree that the on-voltage Von is not reduced to a value not more than the threshold voltage VHL, the alarm indicative of the failure of the rotary switch is generated by the above-described method.

FIG. 19 has shown the example in which the on-resistance Ron of each of the fixed contacts SW0 to SW3 is increased, and the contact is degraded to such a degree that the on-voltage Von is not reduced to a value not more than the threshold voltage V2. However, even when the rotary switch is degraded, the off-resistance Roff of any of the fixed contacts SW0 to SW3 is reduced, and the contact is degraded to such a degree that the off-voltage Voff input to the input port does not become equal to or more than the threshold voltage V1, the off-voltage Voff of the SSW voltage (any of the SSW0 voltage to the SSW3 voltage) input from the degraded contact does not reach the threshold voltage V1, and hence the signal S is asserted while the degraded contact is at an OFF position and the time measurement value of the counter CT reaches the set value CTL so that the warning signal WS is output. Note that, in the case where both of the increase in the on-resistance Ron and the reduction in the off-resistance Roff occur, the warning signal WS is output in the manner described above as a matter of course.

Figure 20:
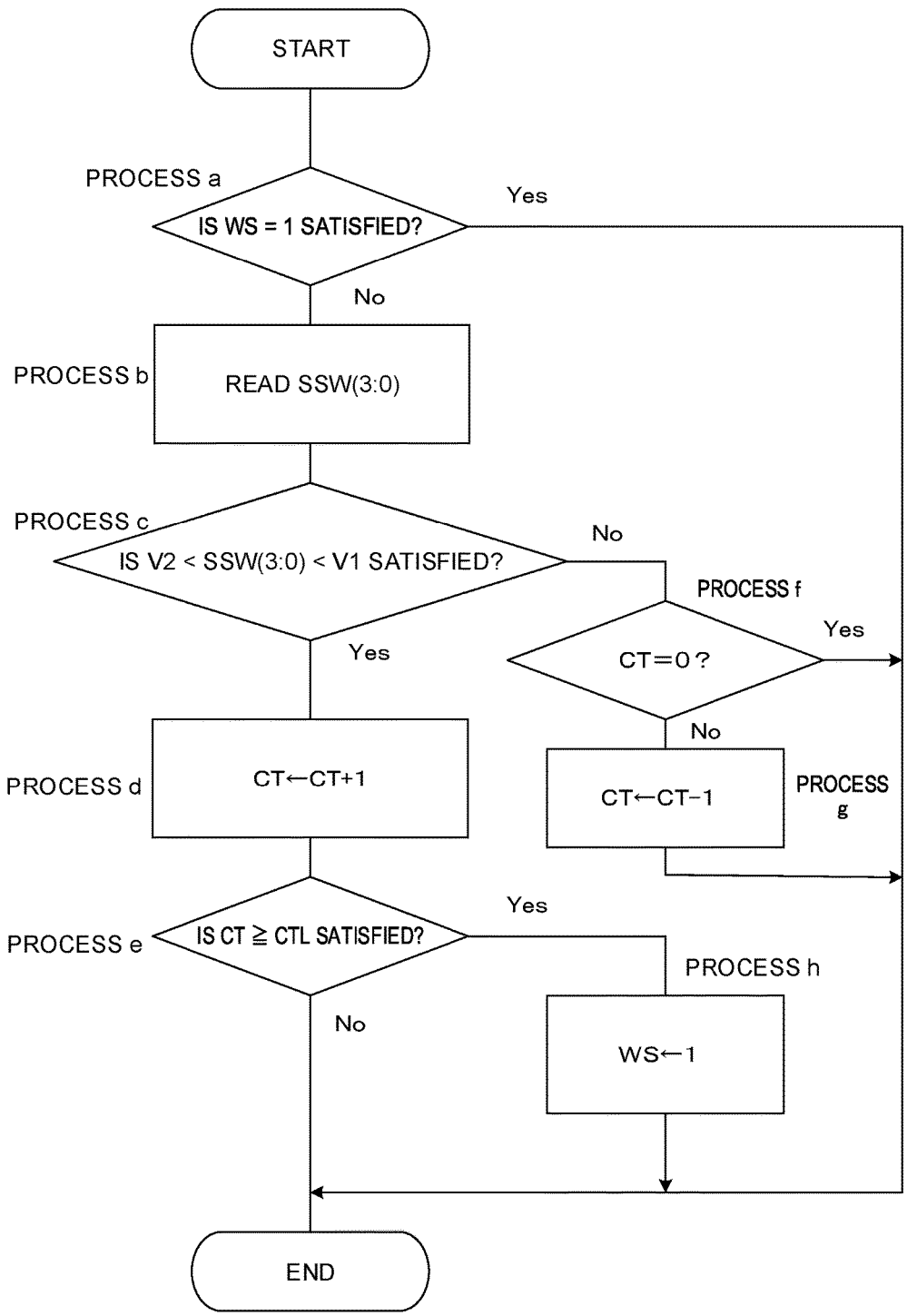
FIG. 20 is a flowchart showing an algorithm of a portent detection process by the controller of the rotary switch in FIG. 17.

FIG. 20 is a flowchart showing the algorithm of the portent detection process executed by the microcomputer 2 in the fourth embodiment. The microcomputer 2 executes the process shown in FIG. 20 in each predetermined period. Note that the variable WS indicative of the warning state and the counter CT are set to "0" in the initial setting.

First, it is determined whether or not the variable WS indicative of the warning state is "1" (Process a). Since the variable WS is set to "0" in the initial setting, the flow proceeds to Process b, and the contact output signals SSW (3:0) (=SSW0 to SW3) input to the input ports are read. It is determined whether or not the values of the read contact output signals SSW(3:0) are in a section between the set threshold values V1 and V2 (V2<SSW (3:0)<V1) (Process c). When all of the contact output signals (SSW0 to SW3) are not in the section, after it is confirmed that the counter CT is not 0 (Process f), the counter CT is decremented by 1 (Process g), and the process in this period is ended. On the other hand, in the case where the counter CT is 0 (Process f), the counter CT is maintained at 0, and the process in the period is ended.

On the other hand, when the magnitude of even one of the contact output signals is in the section between the set threshold values V1 and V2, the counter CT is incremented by 1 (Process d), it is determined whether or not the value of the counter CT has reached the set value CTL (Process e), and the process in the current period is ended when the value does not reach the set value CTL. From the next period, as long as the magnitude of even one of the contact output signals (SSW0 to SW3) is in the section between the set threshold values V1 and V2, Processes a to e are executed. Subsequently, when it is determined that all of the contact output signals (SSW0 to SSW3) are not in the section between the threshold values V1 and V2 by Process c before the counter CT reaches the set value CTL, after it is confirmed that the counter CT is not 0 (Process f), the counter CT is decremented by 1 (Process g), and the process in the current period is ended. That is, while it is determined that all of contact output signals (SSW0 to SSW3) are not in the section between the set threshold values V1 and V2 by Process c, the counter CT is repeatedly decremented by 1, and 0 is maintained in the counter CT at the time point when the counter CT becomes 0.

However, when the state in which the magnitude of even one of the contact output signals (SSW0 to SSW3) is in the section between the set threshold values V1 and V2 continues before the value of the counter CT reaches the set value CTL, the flow proceeds from Process e to Process h, the variable WS indicative of the warning state is set to "1", the process in the current period is ended, and the warning signal is generated. From the subsequent period, only Process a is executed, and the process in the period is ended. Thus, the time during which the magnitude of even one of the contact output signals (SSW0 to SSW3) is in the section between the set threshold values V1 and V2 continues until the time corresponds to "CTL×process period time", the warning signal indicative of the portent of the failure of the rotary switch is generated.

In each of the embodiments described above, the failure of the rotary switch and the portent thereof are detected based on the code signal output from the rotary switch and the transition state of the code signal output from the rotary switch by manipulating and rotating the rotary switch. Therefore, even in the case where the rotary switch is broken during a time period from when the power is turned OFF to when the power is turned ON, it is possible to detect the failure of the rotary switch based on the code signal output from the rotary switch and the transition state of the code signal output from the rotary switch by rotating the rotary switch. However, when the power is turned ON, and if a signal that looks good is output from the broken rotary switch, then there is a possibility that an erroneous command is thereby issued. As described above, when the rotary switch is used as the override switch that controls the speed of the motor of the machine tool, there is a possibility that the motor rotates at an unexpected speed due to the erroneous output code when the power is turned ON.

A fifth embodiment of the controller of the rotary switch according to the present invention will be described by using FIGS. 21 and 22.

In the controller of the rotary switch according to the fifth embodiment, in the case where the rotary switch is broken during the time period from when the power is turned OFF to when the power is turned ON, the breakdown of the rotary switch is detected. Also in the fifth embodiment, the transition of the output code by the breakdown of the rotary switch is present during the time period from when the power is turned OFF to the power is turned ON, and hence the breakdown of the rotary switch is detected based on the transition of the output code.

Figure 21:
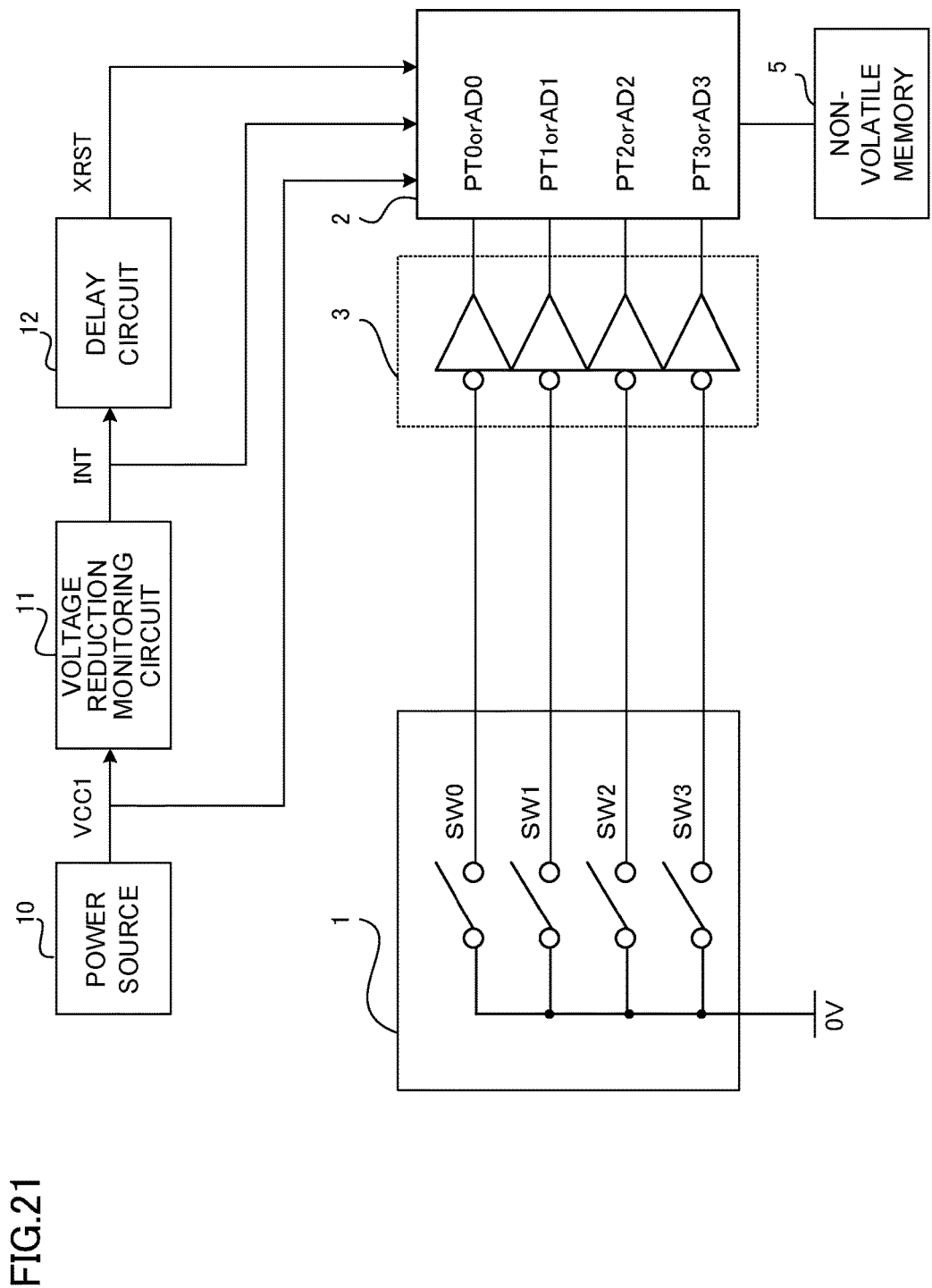
FIG. 21 is a block diagram showing an outline of the controller of the rotary switch according to a fifth embodiment of the present invention.

FIG. 21 is a block diagram showing an outline of the controller of the rotary switch according to the fifth embodiment.

The outputs of the individual fixed contacts SW0 to SW3 of the rotary switch 1 are connected to the input ports of the microcomputer 2 via the contact receiver 3. Note that the input ports may be digital input ports (PT0 to PT3) or analog input ports (AD0 to AD3). A non-volatile memory 5 is connected to the microcomputer 2, and a voltage reduction monitoring circuit 11 that detects the reduction of the output voltage of a power source 10, and a delay circuit 12 that delays an output INT of the voltage reduction monitoring circuit 11 by a predetermined time are further provided. Power is supplied from the power source 10 to the microcomputer 2. The voltage reduction monitoring circuit 11 monitors a voltage $Vcc_1$ output from the power source 10, and outputs the notice signal INT of power interruption to the delay circuit 12 and the microcomputer 2 when the voltage reduction monitoring circuit 11 detects the reduction of the output voltage $Vcc_1$. In addition, the delay circuit 12 delays the notice signal INT by a predetermined time to generate a power-on reset signal XRST of the microcomputer 2, and outputs the power-on reset signal XRST to the microcomputer 2.

The notice signal INT is connected to the input port or an interruption input terminal of the microcomputer 2. In the case where the notice signal INT is connected to the input port, the microcomputer 2 periodically monitors the input port. When the power source 10 is turned OFF and the output voltage $Vcc_1$ is reduced, the voltage reduction monitoring circuit 11 detects the voltage reduction, and asserts the notice signal INT. When the microcomputer 2 detects that the notice signal INT is asserted, the microcomputer 2 reads the output code from the rotary switch 1 and writes the output code in an electrically writable non-volatile memory (e.g., an EEPROM) before the power-on reset signal XRST output from the delay circuit 12 is asserted.

In the case where the notice signal INT is connected so as to be input to the interruption input terminal of the microcomputer 2, when the notice signal INT is asserted, the microcomputer 2 activates interruption handling, and reads the output code from the rotary switch 1 and writes the output code in the electrically writable non-volatile memory before the power-on reset signal XRST is asserted.

On the other hand, when the power is turned ON, the microcomputer 2 reads the output code output from the rotary switch 1 and also reads the output code when the power is turned OFF that is stored in the non-volatile memory 5, compares the read output codes with each other, and outputs an alarm when a mismatch is detected.

In the fifth embodiment, when the position of the rotary switch 1 is changed when the power is OFF, the alarm is output even when the rotary switch 1 is a conforming item without the failure. To cope with this, when the alarm is generated when the power is turned ON, an operator compares a command content (an override value or the like) expected from the current position of the rotary switch with an actual command content (the override value or the like) and, when it is determined that the command contents match each other, the rotary switch is considered to be the conforming item, and hence the operator may cancel the alarm.

Figure 22:
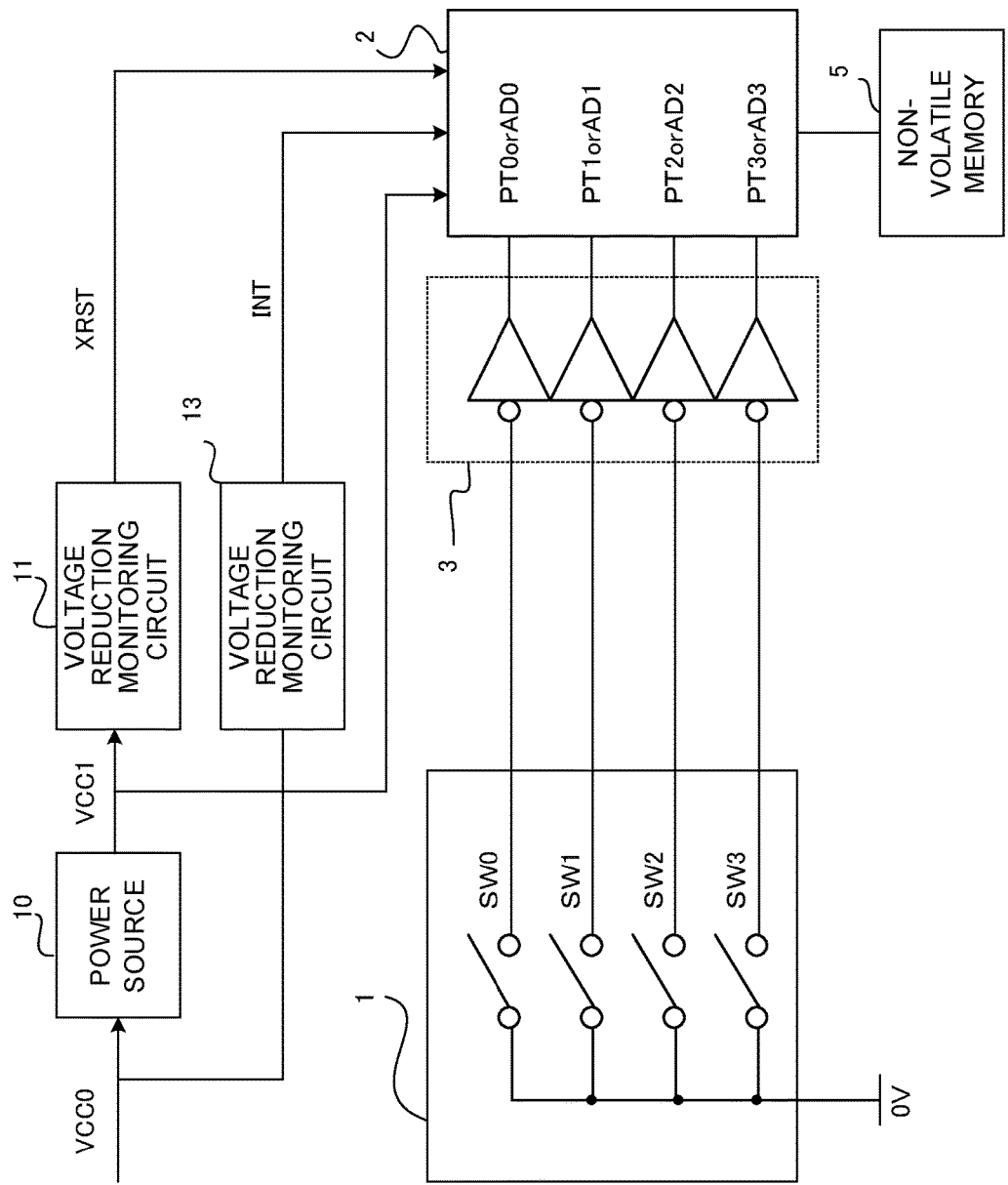
FIG. 22 is a block diagram showing an outline of the controller of the rotary switch according to a modification example of the fifth embodiment of the present invention.

FIG. 22 is a modification example of the controller of the rotary switch according to the fifth embodiment shown in FIG. 21, and the modification example thereof detects that the rotary switch is broken during the time period from when the power is turned OFF to when the power is turned ON.

The controller of the rotary switch shown in FIG. 22 is different from the fifth embodiment shown in FIG. 21 only in that a voltage reduction monitoring circuit 13 that detects the reduction of a voltage $Vcc_0$ as a generation source that provides power to the power source 10 and outputs the notice signal INT to the microcomputer is provided, the voltage reduction monitoring circuit 11 that monitors the reduction of the voltage $Vcc_1$ output from the power source 10 outputs the power-on reset signal XRST to the microcomputer 2, and the delay circuit is not provided.

In this embodiment, it is necessary to design a timing such that the power-on rest signal XRST is asserted after the notice signal INT is asserted. For example, a time difference is provided by setting a voltage level of determination of the voltage reduction in the voltage reduction monitoring circuit 11 to a level lower than a voltage level of determination of the voltage reduction in the voltage reduction monitoring circuit 13.

The invention claimed is:

1. A controller for a rotary switch, the controller configured to (i) receive, via a contact receiver, signals from a plurality of fixed contacts of the rotary switch that is configured to rotate a movable contact to connect the movable contact to any of the plurality of fixed contacts, and (ii) output a command based on an output code of the rotary switch formed of the received signals, the controller comprising:

a failure detector configured to monitor a transition of the output code received from the contact receiver, and determine that a failure has occurred in the rotary switch in response to the failure detector detecting the transition that does not match a transition pattern of the output code of a case where the rotary switch operates normally;

a timer configured to measure a time during which a voltage of an output signal of the contact receiver is in a predetermined voltage range;

a failure portent detector configured to output a signal indicating a portent of the failure when a time value measured by the timer reaches a predetermined time; and a chattering removal circuit configured to remove a chattering from the output code of the rotary switch by neglecting the output code that continues for a time period shorter than a maximum value of a chattering time of the rotary switch, and
output the output code having the chattering removed for the failure detector to monitor the transition of the output code,
wherein the failure detector is configured to
monitor the transition of the output code from which the chattering has been removed, and
determine that the failure has occurred when the failure detector detects the transition that does not match the transition pattern of the output code from which the chattering has been removed of the case where the rotary switch operates normally, and
the predetermined voltage range is between
a first voltage higher than a first threshold voltage for a failure detection and lower than an off-voltage with which each of the plurality of fixed contacts is in OFF state, and
a second voltage lower than a second threshold voltage, lower than the first threshold voltage, for the failure detection and higher than an on-voltage with which said each of the plurality of fixed contacts is in ON state.

2. The controller of the rotary switch according to claim 1, wherein
the failure detector is further configured by a microcomputer and software executed by the microcomputer,
an output of the contact receiver is connected to an input port of the microcomputer, and
the failure detector is further configured to determine and monitor, by the software executed by the microcomputer, the output code determined from a signal state of the input port when determining whether the failure has occurred in the rotary switch or not.

3. The controller of the rotary switch according to claim 2, wherein the input port of the microcomputer is a digital input port.

4. The controller of the rotary switch according to claim 2, wherein
the input port of the microcomputer is an analog port, and the failure detector is further configured to
compare the predetermined voltage range with a voltage of each of the signals input to the input port from the plurality of fixed contacts,
compare the output code by judging an ON/OFF state of said each of the plurality of fixed contacts, and
determine whether the failure has occurred in the rotary switch based on the transition of the output code.

5. The controller of the rotary switch according to claim 2, further comprising:
a voltage reduction monitoring circuit configured to detect a voltage reduction of a power source of the microcomputer or a generation source that supplies power to the power source; and
an electrically writable non-volatile memory, wherein
the microcomputer is configured to write the output code input from the input port into the non-volatile memory and retain the output code therein when the voltage reduction monitoring circuit detects the voltage reduction,
compare the output code input from the input port with the output code retained in the non-volatile memory at a next power-on of the microcomputer, and
determine that the failure has occurred in the rotary switch when a mismatch is detected in the comparison.

6. The controller of the rotary switch according to claim 1, wherein
the failure detector is further configured by hardware.

7. The controller of the rotary switch according to claim 1, wherein
the failure detector includes an unused code detection circuit configured to detect a code that is not assigned to the output code of the rotary switch, and output an unused code alarm signal.

8. The controller according to claim 1, wherein, when the rotary switch operates normally, the rotary switch is further configured to transition the output code in accordance with a transition of a position of the rotary switch when the rotary switch is manipulated.

9. The controller according to claim 1, further comprising a memory configured to store the output code of the rotary switch when a power is turned OFF.

10. The controller according to claim 1, wherein the failure detection is configured to determine that the failure has occurred when the output code is different from a second output code at an adjacent position of the rotary switch.

11. A controller for a rotary switch, the controller comprising a processor configured to:
receive, via a contact receiver, signals from a plurality of fixed contacts of the rotary switch that is configured to rotate a movable contact to connect the movable contact to any of the plurality of fixed contacts,
output a command based on an output code of the rotary switch formed of the received signals,
monitor a transition of the output code received from the contact receiver,
determine that a failure has occurred in the rotary switch in response to a detection of the transition that does not match a transition pattern of the output code of a case where the rotary switch operates normally,
measure a time during which a voltage of an output signal of the contact receiver is in a predetermined voltage range;
cause to output a signal indicating a portent of the failure when the measured time reaches a predetermined time,
remove a chattering from the output code of the rotary switch by neglecting the output code that continues for a time shorter than a time of a maximum value of a chattering time of the rotary switch,
output the output code having the chattering removed,
monitor the transition of the output code from which the chattering has been removed, and
determine that the failure has occurred upon detecting the transition that does not match the transition pattern of the output code from which the chattering has been removed of the case where the rotary switch operates normally,
wherein the predetermined voltage range is between a first voltage higher than a first threshold voltage for a failure detection and lower than an off-voltage with which each of the plurality of fixed contacts is in OFF state, and a second voltage lower than a second threshold voltage, lower than the first threshold voltage, for the failure detection and higher than an on-voltage with which said each of the plurality of fixed contacts is in ON state.

* * * * *